(12) United States Patent
Wu

(10) Patent No.: US 6,734,485 B2
(45) Date of Patent: May 11, 2004

(54) VERTICAL DRAM CELL STRUCTURE AND ITS CONTACTLESS DRAM ARRAYS

(76) Inventor: Ching-Yuan Wu, 1F, No. 20-1, Lane 281, Zhongyang Rd., Hsinchu (TW)

( * ) Notice: Subject to any disclaimer, the term of this patent is extended or adjusted under 35 U.S.C. 154(b) by 0 days.

(21) Appl. No.: 10/236,958

(22) Filed: Sep. 9, 2002

(65) Prior Publication Data
US 2004/0046200 A1 Mar. 11, 2004

(51) Int. Cl.[7] .............................................. H01L 27/108
(52) U.S. Cl. ..................... 257/301; 257/301; 257/302
(58) Field of Search .................. 257/301, 296, 257/302, 303, 305, 310; 438/243, 304

(56) References Cited

U.S. PATENT DOCUMENTS

| | | | |
|---|---|---|---|
| 5,272,367 A | * 12/1993 | Dennison et al. | ............ 257/306 |
| 6,368,912 B1 | * 4/2002 | Chang et al. | ................ 438/248 |
| 6,552,382 B1 | * 4/2003 | Wu | ............................. 257/305 |

* cited by examiner

Primary Examiner—Huan Hoang
Assistant Examiner—Thinh T Nguyen
(74) Attorney, Agent, or Firm—Pro-Techtor International Services

(57) ABSTRACT

A vertical DRAM cell structure is disclosed by the present invention, in which a trench structure comprises a deep-trench region having a vertical transistor and a second-type STI region being formed in a side portion of the deep-trench region and a common-drain structure comprises different implant regions under a common-drain diffusion region being formed in another side portion of the deep-trench region. The vertical DRAM cell structure is used to implement two contactless DRAM arrays. A first-type contactless DRAM array comprises a plurality of metal bit-lines integrated with planarized common-drain conductive islands and a plurality of highly conductive word-lines. A second-type contactless DRAM array comprises a plurality of metal word-lines integrated with planarized common-gate conductive islands and a plurality of common-drain conductive bit-lines.

20 Claims, 25 Drawing Sheets

US 6,734,485 B2

VERTICAL DRAM CELL STRUCTURE AND ITS CONTACTLESS DRAM ARRAYS

BACKGROUND OF THE INVENTION

1. Field of the Invention

The present invention relates generally to a trench-type DRAM memory cell and its DRAM arrays and, more particularly, to a vertical DRAM cell structure and its contactless DRAM arrays.

2. Description of Related Art

A dynamic random-access-memory (DRAM) cell including an access transistor and a storage capacitor has become the most important storage element in electronic system, especially in computer and communication system. The DRAM density is increased very rapidly in order to decrease the cost per bit and, therefore, an advanced photolithography is needed to decrease the minimum-feature-size (F) of a cell.

The output voltage of a DRAM cell is proportional to the capacitance value of the storage capacitor of the DRAM cell and, therefore, the storage capacitor must have a satisfactory capacitance value to have stable operation of the cell as the applied voltage is scaled. Basically, the storage capacitor can be implemented in a trench-type or a stack-type. The trench-type is formed by forming a deep trench in a semiconductor substrate without increasing the surface area of the semiconductor-substrate surface. The stack-type is formed by implementing a capacitor structure over the access transistor and its nearby dummy-transistor structure through the conductive contact-plug over the node diffusion region of the access transistor. Basically, the cell size of the stack-type DRAM is limited by a dummy transistor being formed over the isolation region. Accordingly, the limit cell size of the stack-type DRAM is $8F^2$ for shallow-trench-isolation. However, the cell size of a trench-type lateral transistor DRAM is limited by the space between nearby deep-trench capacitors and the separation between the lateral access transistor and the deep-trench capacitor. Therefore, the limit cell size of a trench-type lateral transistor DRAM is also $8F^2$ if the separation between the lateral access transistor and the trench capacitor can't be minimized.

A typical example of a trench-type lateral transistor DRAM cell is shown in FIG. 1, in which a deep trench is formed in a semiconductor substrate 100. A trench capacitor is formed in a lower portion of the deep trench, in which a lower capacitor node 101 is formed by a heavily-doped n+ diffusion region using an arsenic-silicate-glass (ASG) film as a dopant diffusion source; an upper capacitor node 103a is made of doped polycrystalline-silicon; and a capacitor-dielectric layer 102 is formed by a composite dielectric layer such as an oxide-nitride-oxide structure or a nitride-oxide structure. An oxide collar 104 is used to separate the lower capacitor node 101 from a source diffusion region 105a, 105b, and a capacitor-node connector 103b being made of doped polycrystalline-silicon is used to electrically connect the upper capacitor node 103a to a source conductive node 103c. The source conductive node 103c is made of heavily-doped polycrystalline-silicon to act as a dopant diffusion source for forming an n+ source diffusion region 105a; A shallow-trench-isolation (STI) region 106 is filled with a CVD-oxide layer in order to separate nearby trench capacitors. Two gate-stacks 108, 109 are formed over an upper surface, in which one gate-stack 108 is acted as a passing word line and another gate-stack 109 is acted as an excess transistor. A common-source diffusion region 105b, 105a and a common-drain diffusion region 107 for a bit-line node are formed in an upper surface portion of the semiconductor substrate 100. From FIG. 1, it is clearly seen that the limit cell size is $8F^2$ if the space between two nearby trench capacitors is defined to be a minimum-feature-size (F) of technology used.

Apparently, the common-source diffusion region 105b, 105a and the gate-stack 109 shown in FIG. 1 can be removed and are formed in the deep-trench region to become a vertical DRAM cell structure, then the semiconductor surface area occupied by a cell can be reduced to be $4F^2$. However, a depth of the deep trenches becomes deeper, resulting in a further problem for forming a deeper trench. Moreover, the threshold-voltage and the punch-through voltage of the vertical transistor are difficult to be controlled, and a longer channel length is therefore used by the prior art. As a consequence, a deeper trench depth is required, and a slower read/write speed of a memory cell due to a longer channel length becomes another serious problem for the prior art.

It is, therefore, a major objective of the present invention to offer a vertical DRAM cell structure for obtaining a cell size of $4F^2$.

It is another objective of the present invention to easily offer different implant regions for forming punch-through stops and adjusting threshold-voltages of the vertical transistor and the parasitic collar-oxide transistor in a self-aligned manner so a deeper trench is not required.

It is a further objective of the present invention to offer a manufacturing method for forming a vertical DRAM cell structure and its contactless DRAM arrays with less masking photoresist steps.

It is yet another objective of the present invention to offer two different contactless DRAM array structures for high-speed read and write operations.

SUMMARY OF THE INVENTION

A vertical DRAM cell structure and its contactless DRAM arrays are disclosed by the present invention. The vertical DRAM cell structure comprises a trench structure and a common-drain structure, in which the trench structure comprises a deep-trench region having a vertical transistor and a trench-isolation region having a second-type shallow-trench-isolation region formed in a side portion of the deep-trench region and the common-drain structure includes a common-rain diffusion region and different implant regions under the common-drain diffusion region for forming punch-through stops of the vertical transistor and the parasitic collar-oxide. transistor. The deep-trench region comprises a lower capacitor node made of an n+ diffusion region being formed in a lower portion of a deep trench, a capacitor-dielectric layer being formed over the lower capacitor node, an upper capacitor node being formed over the capacitor-dielectric layer, a collar-oxide layer together with a capacitor-node connector being formed over a portion of the capacitor-dielectric layer and the upper capacitor node, a source conductive node being formed over the collar-oxide layer and the capacitor-node connector to act as a dopant diffusion source for forming a common-source diffusion region, an isolation silicon-dioxide node being formed over the source conductive node, and a conductive-gate node of a vertical transistor being formed on the isolation silicon-dioxide node. The second-type shallow-trench-isolation region being formed in a side portion of the deep-trench region comprises a second-type raised field-oxide layer with a bottom surface level approximately equal to that of the collar-oxide. layer and an n+ diffusion region being formed under the second-type raised field-oxide layer. The vertical transistor comprises a planarized capping conductive-gate layer defined by a third sidewall dielectric spacer being connected with the conductive-gate node, a gate-dielectric layer being formed over a portion of a sidewall of the deep trench, a common-drain diffusion region of a second conductivity type being formed over an upper portion of the semiconductor substrate, and the common-source diffusion region of the second conductivity type being formed near the source conductive node for forming a first-type vertical DRAM cell; and comprises the conductive-gate node being formed in an upper portion of the deep trench, a planarized common-gate conductive island integrated with a metal word-line being connected with a portion of the conductive-gate node through a planarized conductive-gate connector, a gate-dielectric layer being formed over a portion of a sidewall of the deep trench, a common-drain diffusion region of a second conductivity type being formed over an upper portion of the semiconductor substrate, and a common-source diffusion region of the second conductivity type being formed near the source conductive node for forming a second-type vertical DRAM cell. The common-drain region comprises the common-drain diffusion region having a shallow heavily-doped diffusion region formed within a lightly-doped diffusion region, different implant regions under the common-drain diffusion region for forming punch-through stops and adjusting threshold voltages of the vertical transistor and the parasitic collar-oxide transistor, and a planarized common-drain conductive island integrated with a metal bit-line being formed on the common-drain diffusion region outside of a fourth sidewall dielectric spacer formed over a sidewall of the trench region for forming the first-type vertical DRAM cell; and comprises a common-drain diffusion region having a shallow heavily-doped diffusion region formed within a lightly-doped diffusion region, different implant regions under the common-drain diffusion region for forming punch-through stops and adjusting threshold voltages of the vertical transistor and the parasitic collar-oxide transistor, and a common-drain conductive bit-line being formed at least over the common-drain diffusion region outside of the fourth sidewall dielectric spacer being formed over a sidewall of the trench region for forming the second-type vertical DRAM cell. The cell size of the vertical DRAM cell structure can be fabricated to be equal to $4F^2$.

The vertical DRAM cell structure of the present invention is used to implement two contactless DRAM arrays. A first-type contactless DRAM array comprises a plurality of first-type vertical DRAM cells, a plurality of metal bit-lines integrated with planarized common-drain conductive islands being patterned to be aligned above a plurality of active regions, and a plurality of planarized capping conductive-gate layers connected with the conductive-gate nodes to act as a plurality of conductive word-lines being formed transversely to the plurality of metal bit-lines. A second-type contactless DRAM array comprises a plurality of second-type vertical DRAM cells, a plurality of metal word-lines integrated with planarized common-gate conductive islands over planarized conductive-gate connector islands being patterned to be aligned above a plurality of active regions, and a plurality of highly conductive common-drain bus-lines acted as a plurality of conductive bit-lines being formed transversely to the plurality of metal word-lines.

BRIEF DESCRIPTION OF THE DRAWINGS

FIG. 3A through FIG. 3J show the process steps and their cross-sectional views of fabricating a vertical DRAM cell structure of the present invention.

DETAILED DESCRIPTION OF THE PREFERRED EMBODIMENTS

Figure 1:
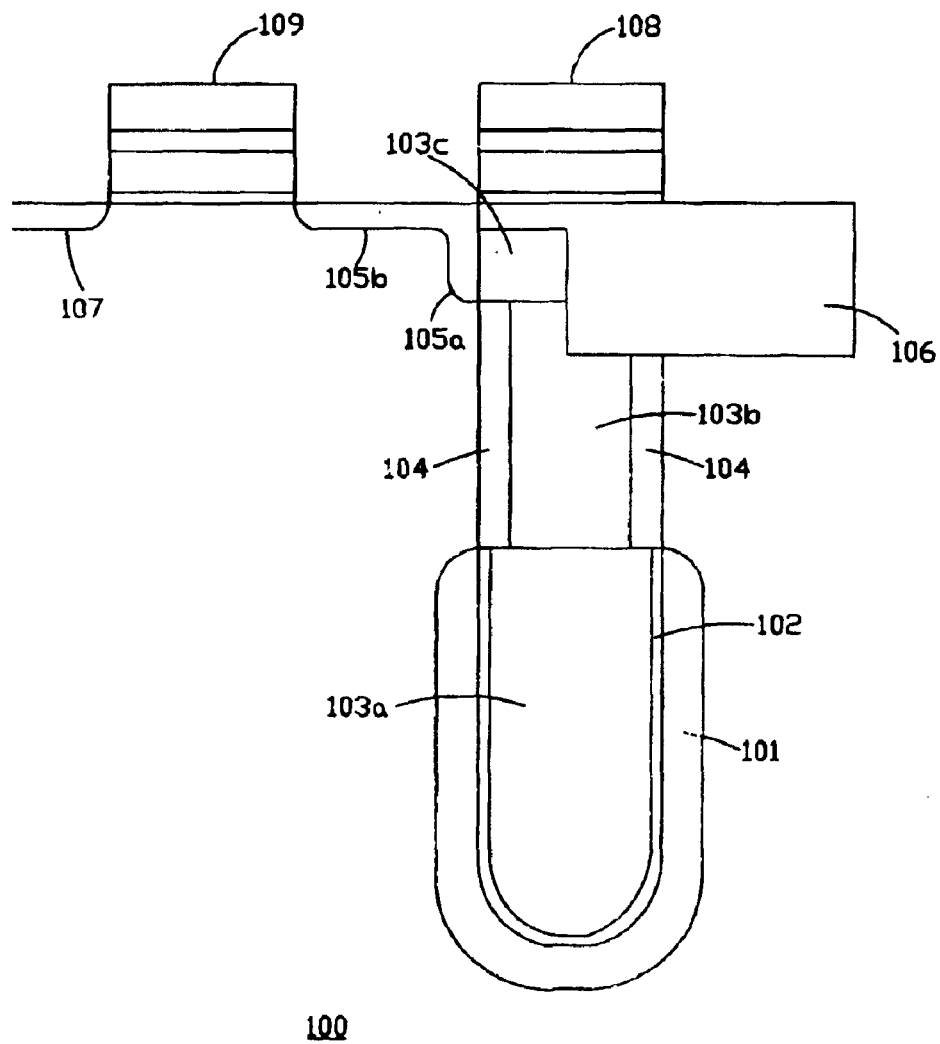
FIG. 1 shows a typical schematic diagram of a trench-type lateral transistor DRAM cell of the prior art.
Figure 2A:
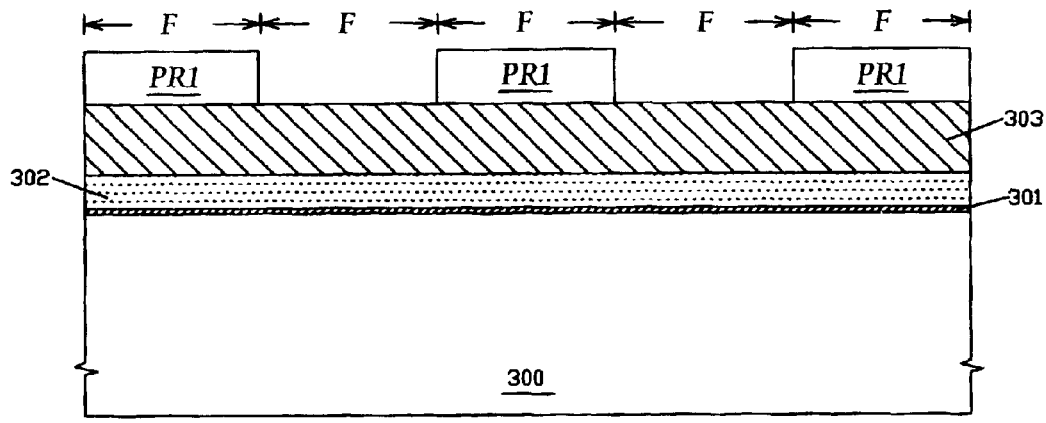
FIG. 2A through FIG. 2C show the process steps and their cross-sectional views of fabricating a first-type shallow-trench-isolation structure for forming a vertical DRAM cell structure of the present invention.
Figure 2B:
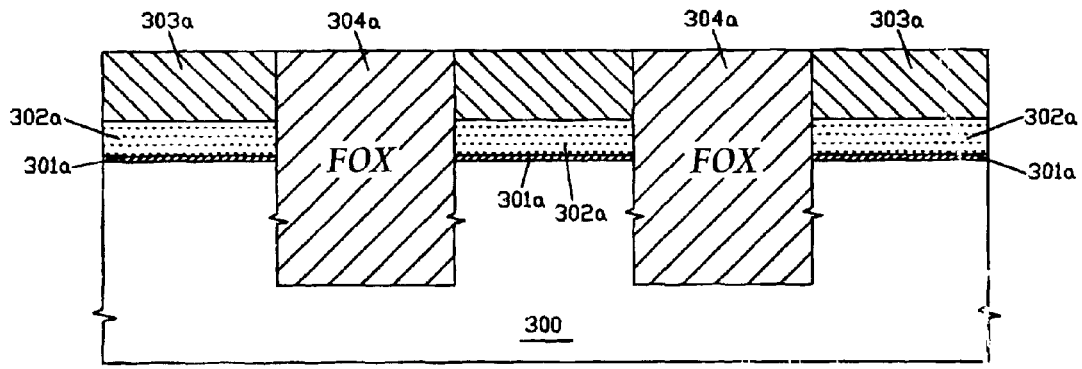
Figure 2C:
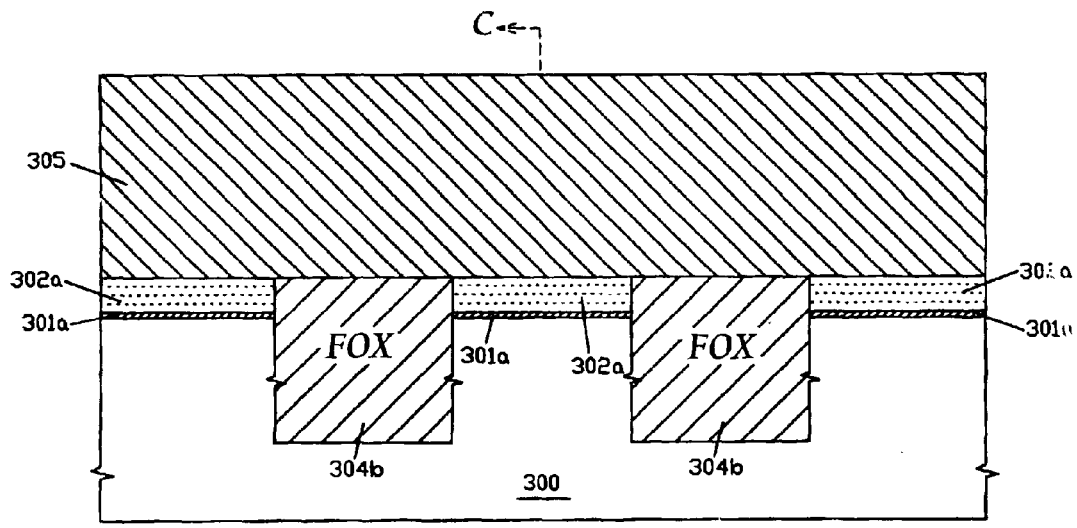

Referring now to FIG. 2A through FIG. 2C, there are shown the process steps and their cross-sectional views of fabricating a first-type shallow-trench-isolation (STI) structure for forming a vertical DRAM cell structure of the present invention. FIG. 2A shows that a first dielectric layer 301 is formed on a semiconductor substrate 300 of a first conductivity type, a first conductive layer 302 is formed on the first dielectric layer 301, a first masking dielectric layer 303 is formed over the first conductive layer 302, and a plurality of masking photoresist PR1 are formed over the first masking dielectric layer 303 to define a plurality of active regions (under PR1) and a plurality of first-type shallow-trench-isolation (STI) regions (outside of PR1). The first dielectric layer 301 is preferably a thermal-oxide layer or a nitrided thermal-oxide layer and its thickness is preferably between 50 Angstroms and 200 Angstroms. The first conductive layer 302 is preferably a doped polycrystalline-silicon or doped amorphous-silicon layer as deposited by low-pressure chemical-vapor-deposition (LPCVD) and its thickness is preferably between 200 Angstroms and 3000 Angstroms. The first masking dielectric layer 303 is preferably made of silicon-nitride as deposited by LPCVD and its thickness is preferably between 1000 Angstroms and 3000 Angstroms. It should be noted that a first anti-reflection coating (ARC) layer (not shown) can be formed over the first masking dielectric layer 303 to act as a hard masking layer for patterning the first masking dielectric layer 303.

FIG. 2B shows that the first masking dielectric layer 303, the first conductive layer 302, and the first dielectric layer 301 outside of the plurality of masking photoresist PR1 are sequentially removed by using anisotropic dry etching; the semiconductor substrate 300 is then anisotropically etched to form first-type shallow trenches, and the plurality of masking photoresist PR1 are then stripped; and subsequently, the first-type shallow trenches are refilled with first-type planarized field-oxide layers 304a. The depth of the first-type shallow trenches in the semiconductor substrate 300 is between 4000 Angstroms and 15000 Angstroms. The first-type planarized field-oxide layer 304a is preferably made of silicon-dioxide, phosphosilicate glass (p-glass), boro-phosphosilicate glass (BP-glass) as deposited by high-density plasma (HDP) CVD or plasma-enhanced (PE) CVD, and is formed by first depositing a thick-oxide film 304 to fill up each gap formed by the first-type shallow trenches and then planarizing the deposited thick-oxide film 304 using chemical-mechanical polishing (CMP) with the first masking dielectric layer 303a as a polishing stop.

FIG. 2C shows that the first-type planarized field-oxide layers 304a are etched back to a depth equal to a thickness of the first masking dielectric layer 303a to form first-type first raised field-oxide layers 304b and then the first masking dielectric layers 303a are removed by using hot-phosphoric acid or anisotropic dry etching; and subsequently, a second masking dielectric layer 305 is formed over a flat surface being alternately formed by the first conductive layer 302a and the first-type first raised field-oxide layer 304b. The second masking dielectric layer 305 is preferably made of silicon-nitride as deposited by LPCVD and its thickness is preferably between 3000 Angstroms and 10000 Angstroms. The cross-sectional view along an active region as indicated by a C–C' line is shown in FIG. 3A.

Figure 3A:
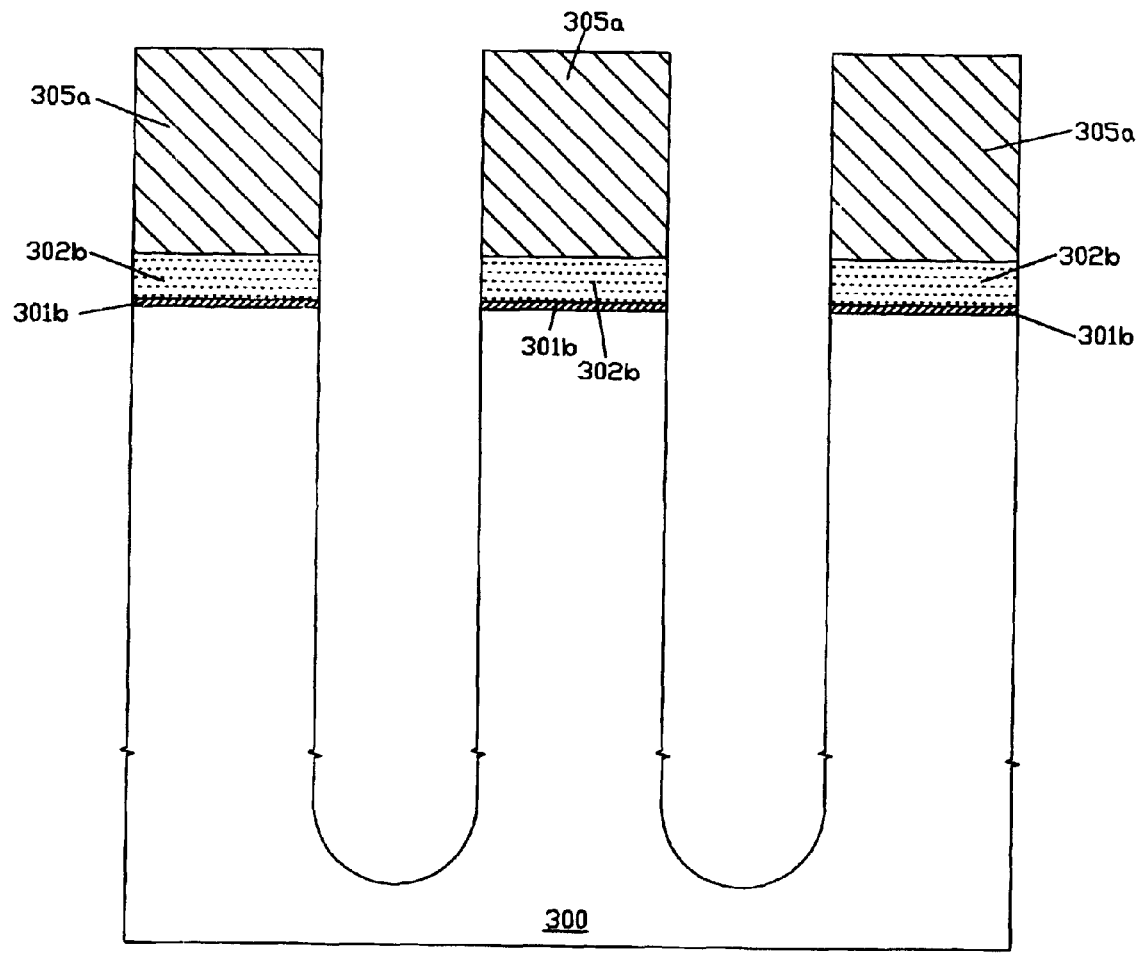

Referring now to FIG. 3A through FIG. 3J, there are shown the process steps and their cross-sectional views of fabricating a vertical DRAM cell structure of the present invention. FIG. 3A shows that a plurality of deep trenches are formed in the semiconductor substrate 300, which includes a masking photoresist step for patterning the second masking dielectric layer 305, an anisotropic dry etching process to sequentially remove the first conductive layer 302a and the first dielectric layer 301a, and a deep-trench etching process. It should be noted that the first-type first raised field-oxide layers 304b in each of the plurality of first-type STI regions are also slightly etched during the removal of the first dielectric layers 301a to form first-type second raised field-oxide layers 304c between the second masking dielectric layers 305a.

Figure 3B:
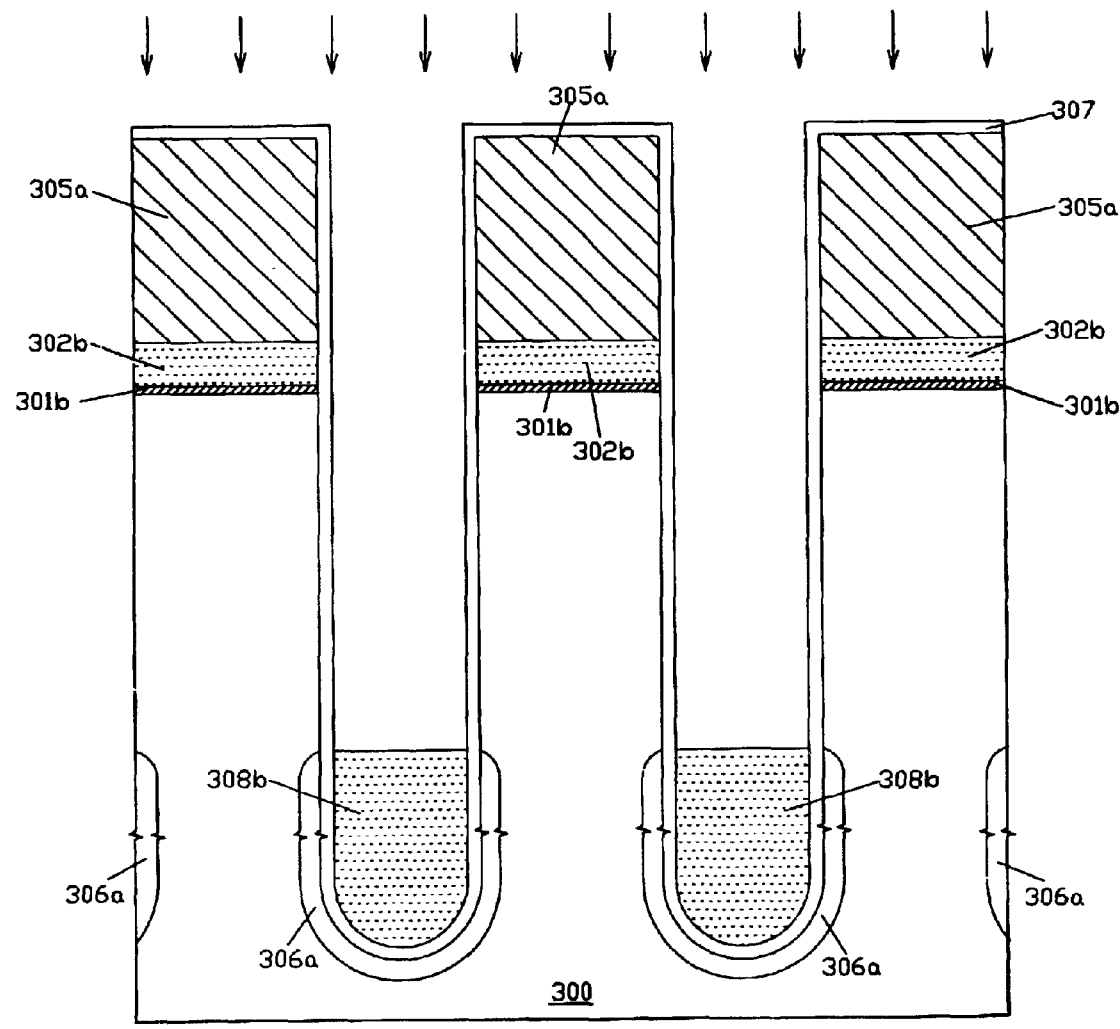

FIG. 3B shows that a lower capacitor node 306a made of a heavily-doped n+ diffusion region is formed in a lower portion of the deep trench; a capacitor-dielectric layer 307 is then formed over a formed structure surface; an upper capacitor node 308b is formed in a lower portion of the deep trench; and subsequently, an ion-implantation is performed in a self-aligned manner to heavily dope the upper capacitor nodes 308b with a high dose of doping impurities of a second conductivity type. The lower capacitor node 306a is formed by the following steps: depositing an arsenic-silicate-glass (ASG) film over a formed structure surface shown in FIG. 3A, forming an etched-back photoresist layer in a lower portion of the deep trench, removing the arsenic-silicate-glass film over a top surface level of the etched-back photoresist layer, removing the etched-back photoresist layer, forming a capping silicon-dioxide layer over the formed structure surface, performing a drive-in process to diffuse the dopants in the remained arsenic-silicate-glass films into the semiconductor substrate 300 to form the lower capacitor nodes 306a, and removing the capping silicon-dioxide layer and the remained arsenic-silicate-glass films. The capacitor-dielectric layer 307 is preferably made of a composite dielectric layer such as an oxide-nitride-oxide (ONO) structure or a nitride-oxide (NO) structure. The upper capacitor node 308b is preferably made of doped polycrystalline-silicon as deposited by LPCVD and is formed by first forming a planarized doped polycrystalline-silicon layer 308a to fill up each gap formed over die deep trenches and then etching back to form the upper capacitor nodes 308b in the lower portion of the deep trenches.

Figure 3C:
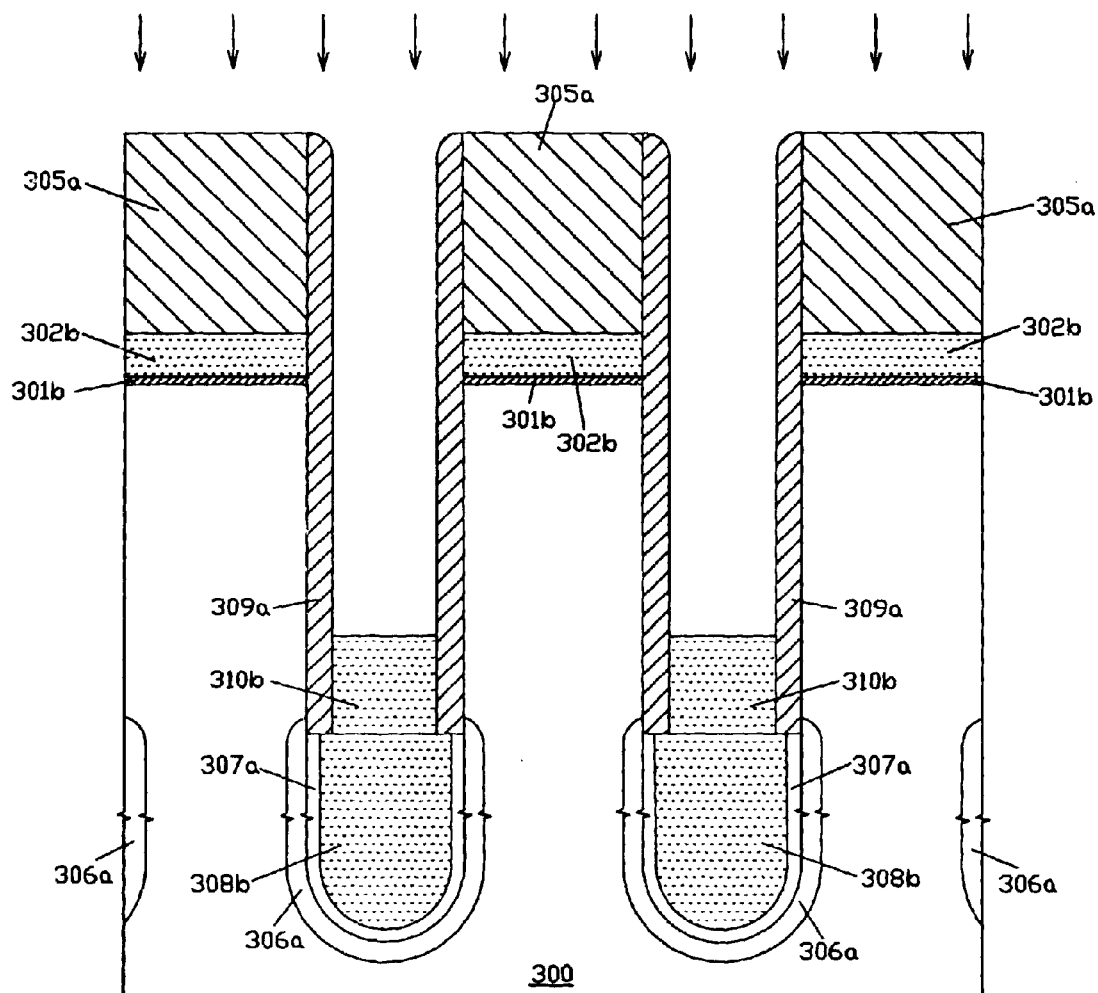

FIG. 3C shows that the capacitor-dielectric layer 307 above a top surface level of the upper capacitor node 308b is removed by wet etching or isotropic dry etching; a silicon-dioxide layer 309 is deposited over a formed structure surface and is then etched back a thickness of the deposited silicon-dioxide layer 309 to form a sidewall silicon-dioxide spacer 309a over each sidewall of the deep trenches; a planarized doped polycrystalline-silicon layer 310a is formed to fill up each gap between the sidewall silicon-dioxide spacers 309a and is then etched back to form capacitor-node connector layers 310b; and subsequently, an ion-implantation is performed to heavily dope the capacitor-node connector layers 310b with a high dose of doping impurities of the second conductivity type.

Figure 3D:
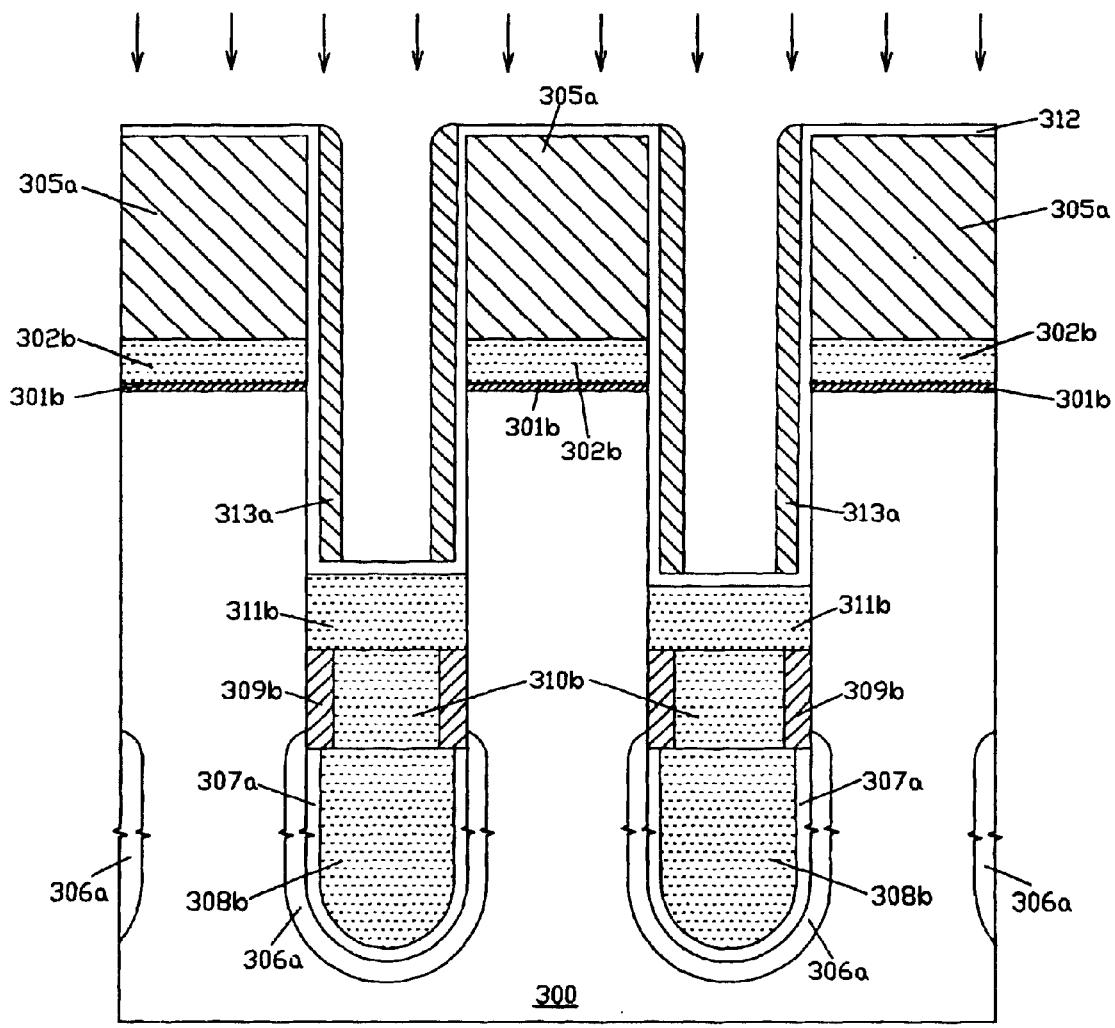

FIG. 3D shows that the sidewall silicon-dioxide spacers 309a above a top surface level of the capacitor-node connector layer 310b are removed to form a collar-oxide layer 309b in each of the deep trenches by dipping in buffered hydrofluoric acid or dilute hydrofluoric acid solution; a source conductive layer 311b is formed over the collar-oxide layer 309b and the capacitor-node connector layer 310b; a thin capping silicon-dioxide layer 312 is formed over a formed structure surface; a thin capping silicon-nitride layer 313 is formed over the thin capping silicon-dioxide layer 312 and is etched back to a thickness of the deposited thin capping silicon-nitride layer 313 to form a thin capping silicon-nitride spacer 313a over each sidewall of the thin capping silicon-dioxide layer 312; and subsequently, an ion-implantation is performed to implant a high dose of doping impurities of the second conductivity type into the source conductive layers 311b in a self-aligned manner to act as the dopant diffusion sources for forming common-source diffusion regions 315a in a later process. The source conductive layer 311b is preferably made of doped polycrystalline-silicon or intrinsic polycrystalline-silicon as deposited by LPCVD and is formed by first depositing, then planarizing, and etching back. The thin capping silicon-dioxide layer 312 is preferably deposited by LPCVD or HTO deposition and its thickness is preferably between 50 Angstroms and 150 Angstroms. The thin capping silicon-nitride layer 313 is preferably deposited by LPCVD and its thickness is preferably between 100 Angstroms and 300 Angstroms. It should be noted that the thin capping silicon-dioxide layer 312 is mainly used as a buffer layer to reduce the thermal stress due to the thin capping silicon-nitride spacer 313a and the thin capping silicon-nitride spacer 313a is used to prevent the trench sidewall from oxidation.

Figure 3E:
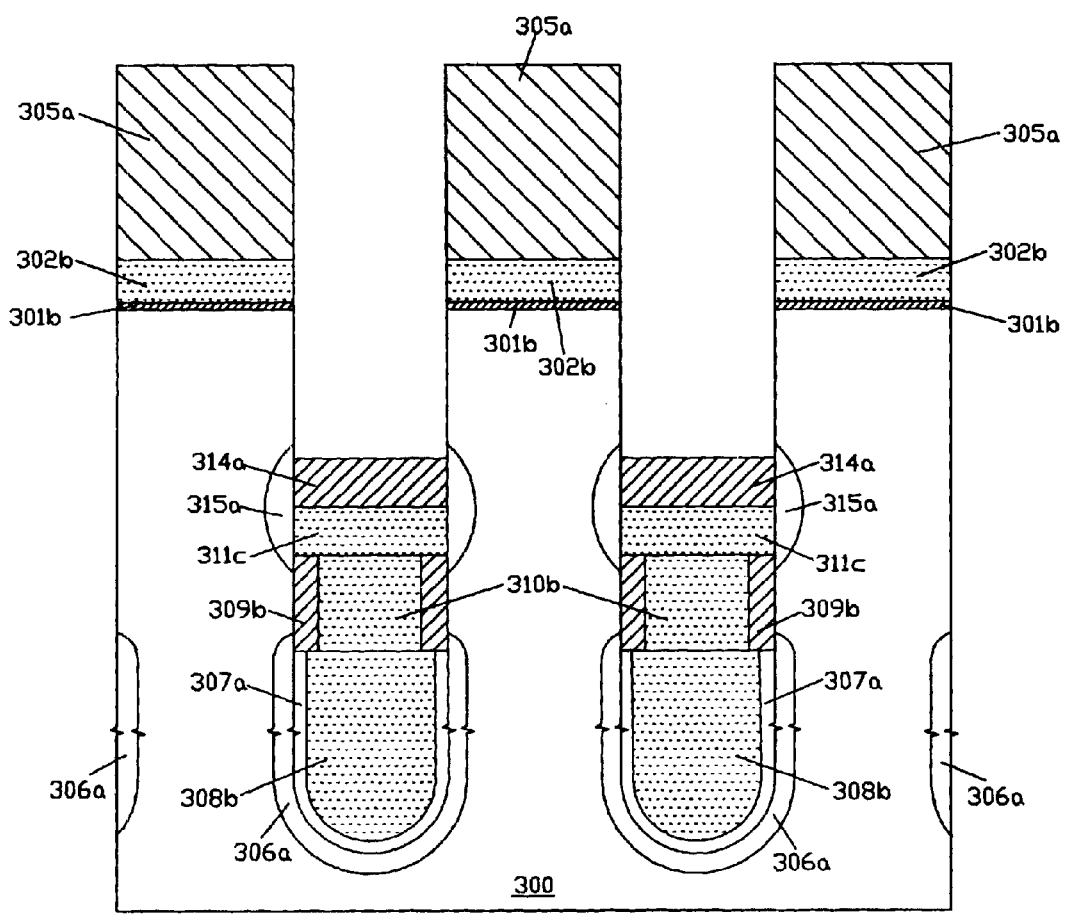

FIG. 3E shows that a thermal-oxidation process is performed to grow an isolation silicon-dioxide layer 314a over the source conductive layer 311c in each of the deep trenches and a common-source diffusion region 315a of the second conductivity type is formed in the semiconductor substrate 300 by out-diffusion of dopant impurities in the source conductive layer 311b; and subsequently, the thin capping silicon-nitride spacers 313a are removed by using hot-phosphoric acid and the thin capping silicon-dioxide layer 312 is then removed by dipping in dilute hydrofluoric acid solution.

Figure 3F:
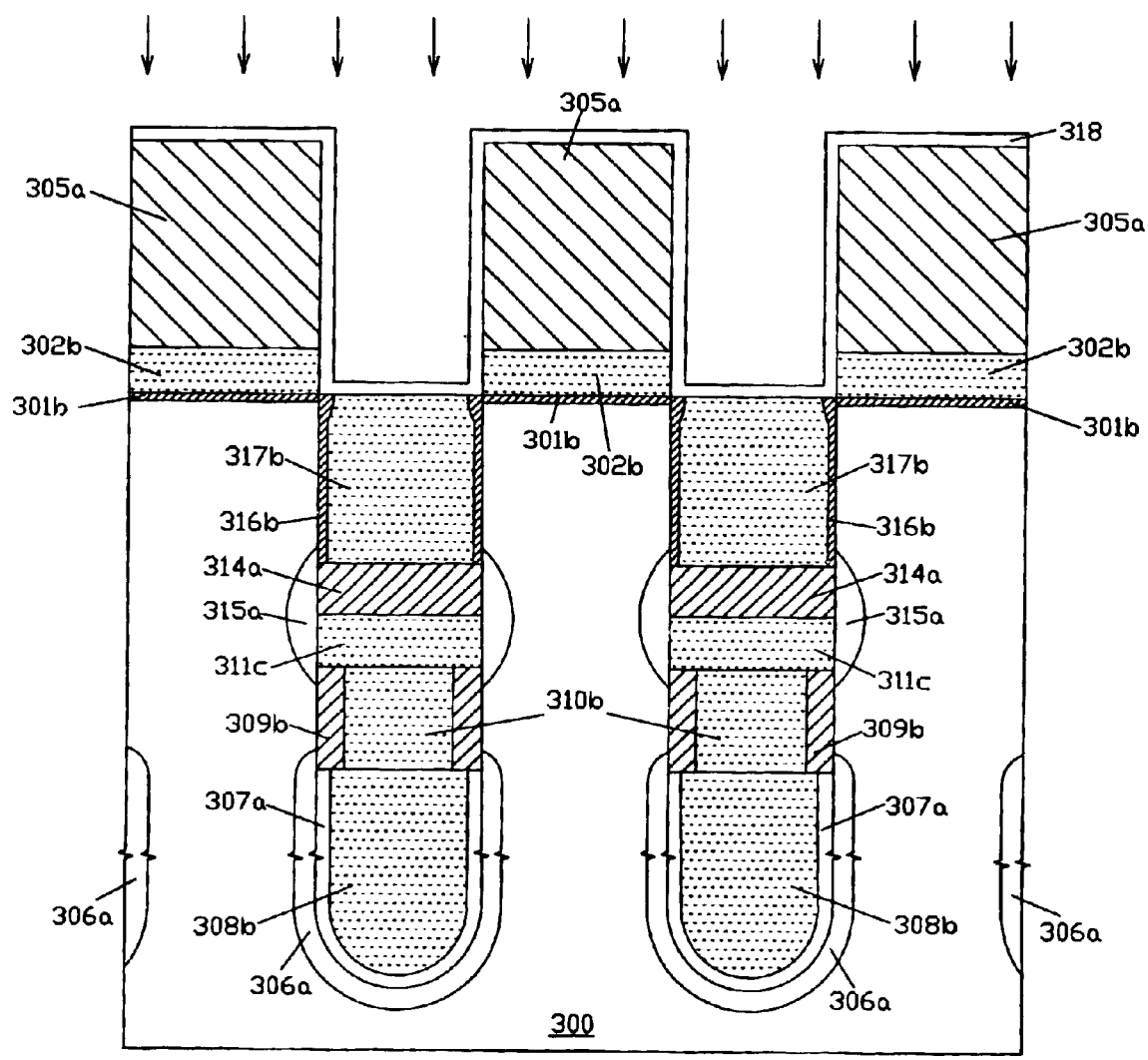

FIG. 3F shows that a gate-dielectric layer 316a is formed over each sidewall of the deep trenches including the first conductive layers 302b, and a conductive-gate layer 317b is formed over the isolation silicon-dioxide layer 314a and the gate-dielectric layer 316a; the first-type second raised field-oxide layers 304c in the first-type STI regions are etched back to the same surface level of the conductive-gate layers 317b to form first-type third raised field-oxide layers 304d; a protective silicon-dioxide layer 318 is formed over a formed structure surface, and an ion-implantation is preformed in a self-aligned manner by implanting a high-dose of doping impurities of the second conductivity type across the protective silicon-oxide layers 318 into the conductive-gate layers 317b. The gate-dielectric layer 316a is preferably a thermal-oxide layer or a nitrided thermal-oxide layer and its thickness is preferably between 15 Angstroms and 150 Angstroms. The conductive-gate layer 317b is preferably made of doped polycrystalline-silicon as deposited by LPCVD and is formed by first depositing a doped polycrystalline-silicon film 317 over a gap between the second masking-dielectric layers 305a, planarizing the deposited doped polycrystalline-silicon film 317 using CMP with the second masking dielectric layer 305a as a polishing stop, and then etching back the planarized doped polycrystalline-silicon layers 317a to a depth approximately equal to a top surface level of the first dielectric layer 301b. The protective silicon-dioxide layer 318 is preferably deposited by LPCVD and its thickness is preferably between 100 Angstroms and 300 Angstroms to protect the channel region in the semiconductor substrate 300 from ion-implantation.

Figure 3G:
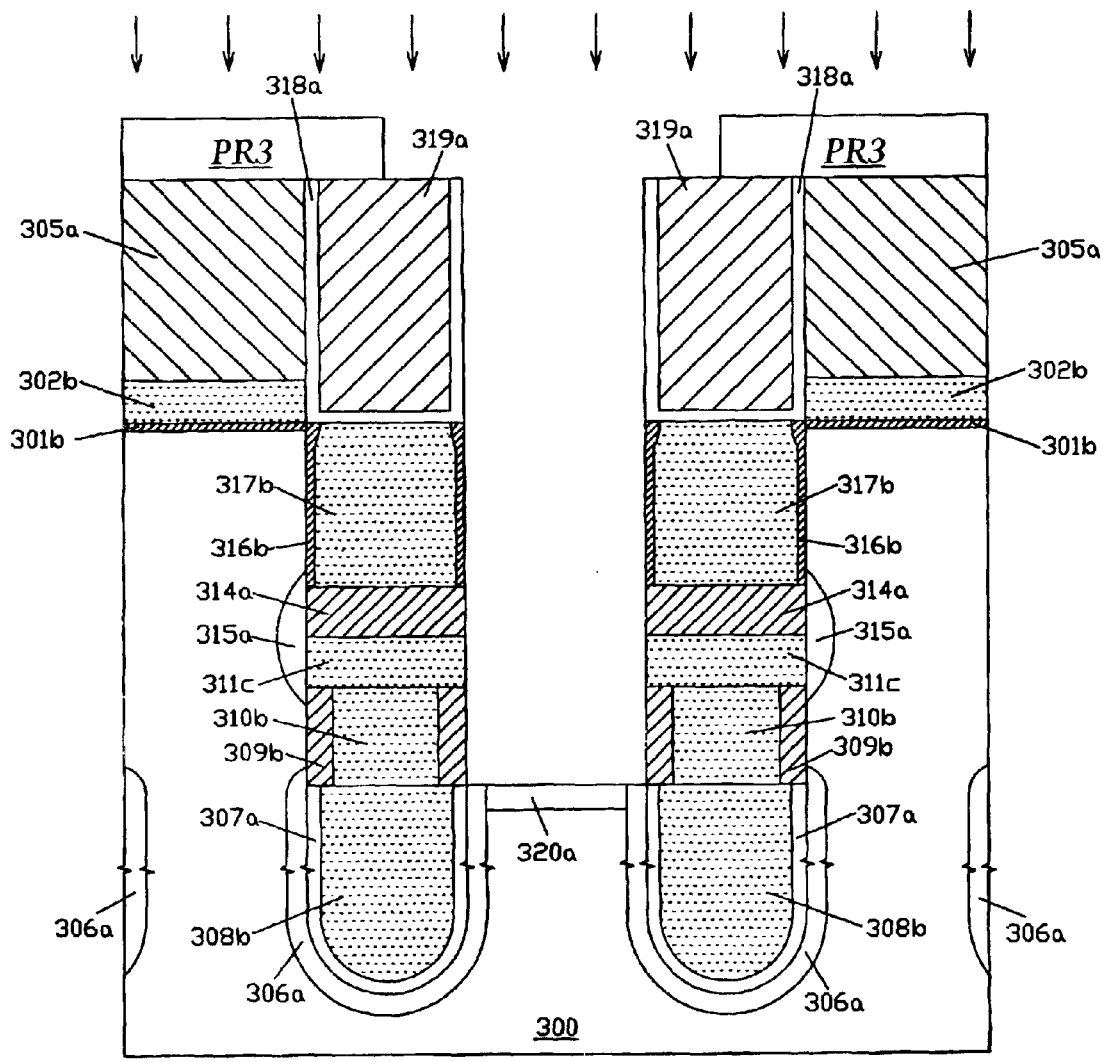

FIG. 3G shows that a first planarized thick-oxide layer 319a is formed over the etched protective silicon-dioxide layer 318a using CMP, a plurality of masking photoresist (PR3) are formed over the common-drain regions and a portion of nearby trench regions, and the second masking dielectric layers 305a in trench isolation regions between the plurality of masking photoresist (PR3) are selectively removed by anisotropic dry etching; the first conductive layers 302b and the first dielectric layers 301b are sequentially removed by anisotropic dry etching; and subsequently, the exposed semiconductor substrates 300 are anisotropically etched to a depth approximately equal to a bottom surface level of the collar-oxide layer 309b for forming second-type STI regions (STI-2) and an ion-implantation can be performed by implanting a high dose of doping impurities into the semiconductor substrate 300 in a self-aligned manner to form the heavily-implanted regions 320a of the second conductivity type, and then the plurality of masking photoresist (PR3) are stripped. The first planarized thick-oxide layer 319a is preferably made of silicon-dioxide, P-glass, or BP-glass as deposited by LPCVD, HDPCVD or PECVD. It should be noted that the heavily-implanted region 320a is connected with the lower capacitor nodes 306a of nearby trench capacitors.

Figure 3H:
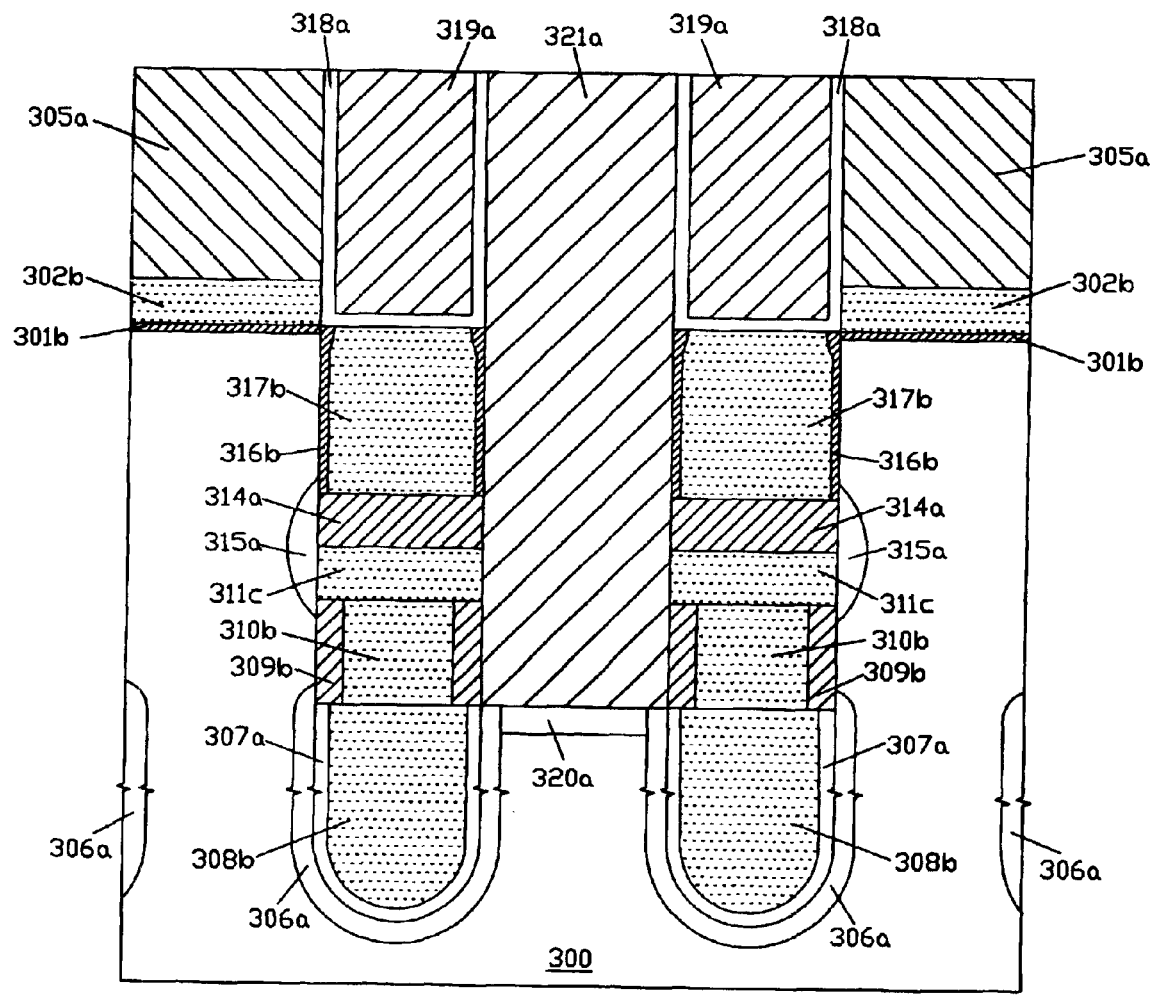
Figure 31:
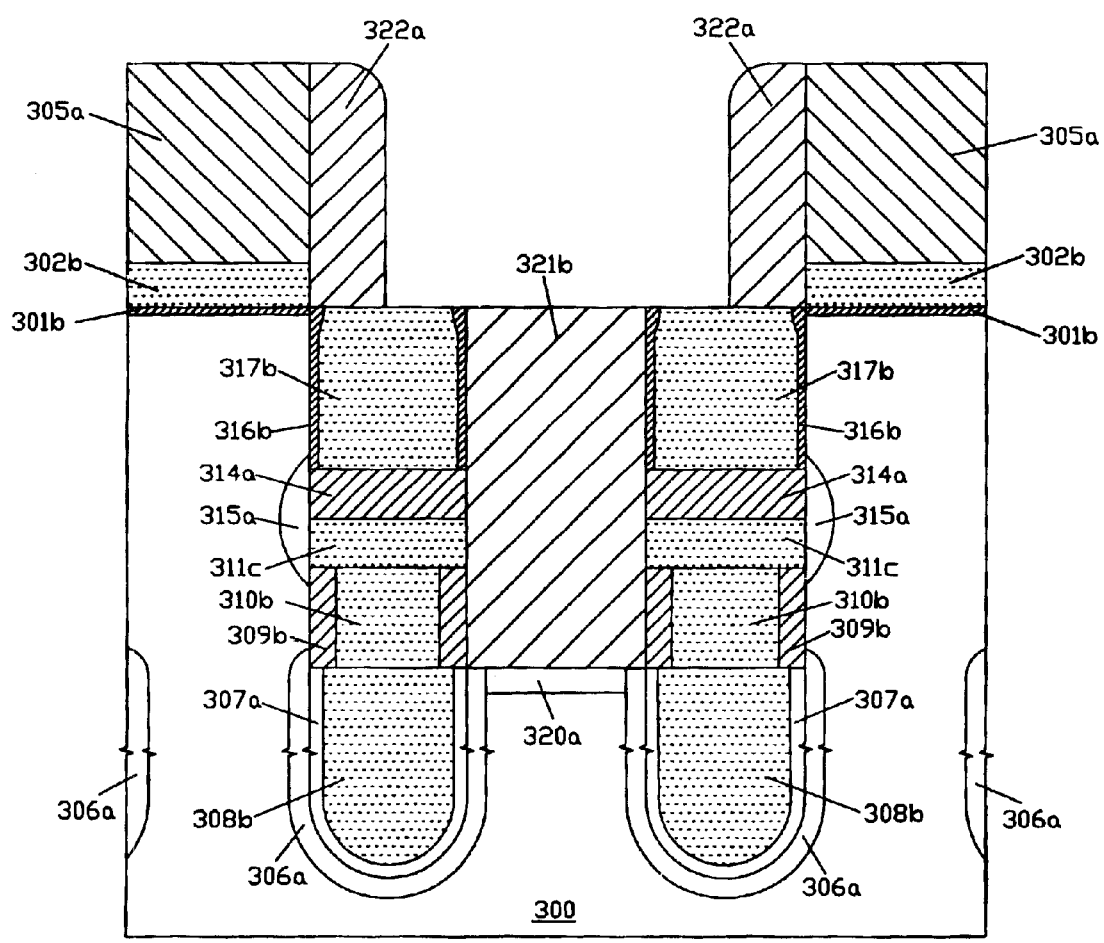

FIG. 3H shows that a second-type planarized field-oxide layer 321a is formed over a gap in the trench isolation region between nearby trench regions. The second-type planarized field-oxide layer 321a is preferably made of silicon-dioxide, P-glass, or BP-glass as deposited by LPCVD, HDPCVD, or PECVD.

FIG. 3I shows that various silicon-dioxide layers between the second masking dielectric layers 305a are etched back to a top surface level of the conductive-gate layers 317b by anisotropic dry etching or wet etching to form a flat surface between the common-drain regions; and a pair of first sidewall dielectric spacers 322a are formed over sidewalls formed by the second masking dielectric layer 305a over the first conductive layer 302b and on a portion of the conductive-gate layers 317b and the first-type third raised field-oxide layers 304d in each of the plurality of trench regions. The first sidewall dielectric spacer 322a is preferably made of silicon-dioxide as deposited by LPCVD and is formed by first depositing a silicon-dioxide layer 322 over a formed structure surface and then etching back a thickness of the deposited silicon-dioxide layer 322.

Figure 3J:
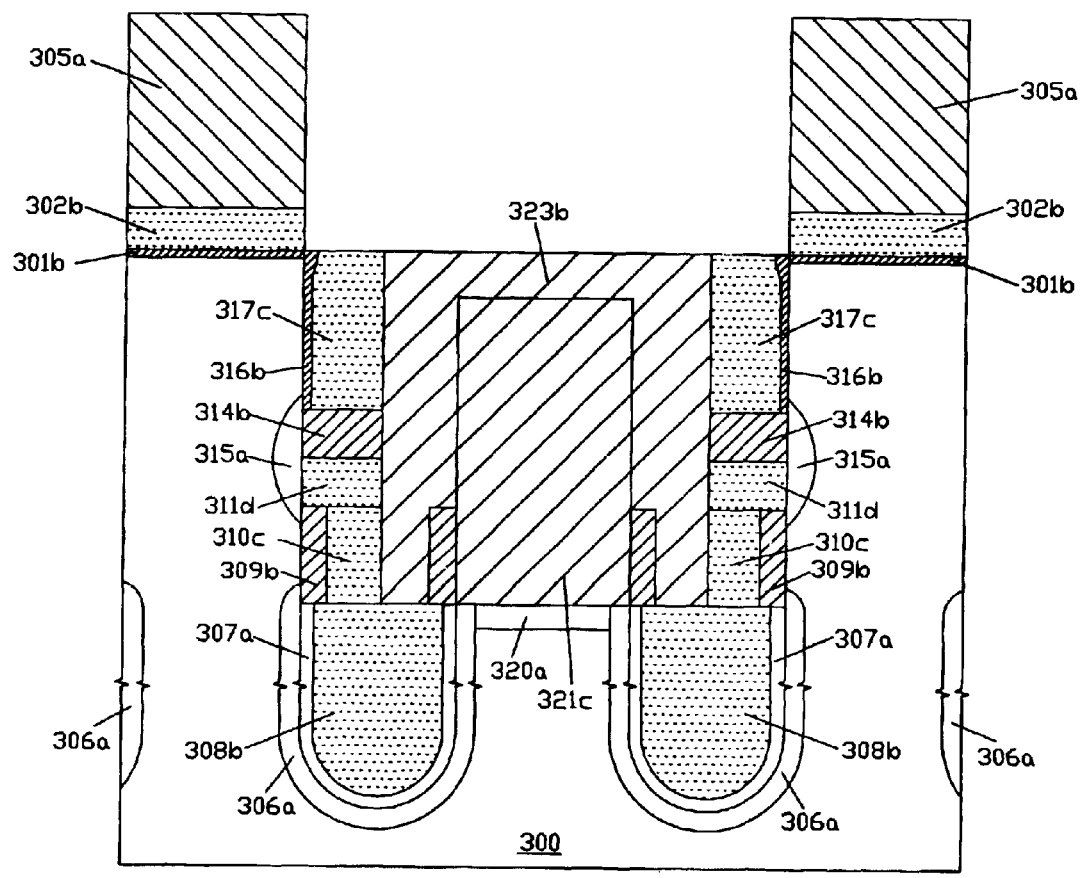

FIG. 3J shows that the conductive-gate layers 317b, the isolation silicon-dioxide layers 314a, the source conductive layers 311c, and the capacitor-node connector layers 310b between the pair of first sidewall dielectric spacers 322a are sequentially removed by anisotropic dry etching to form conductive-gate nodes 317c, isolation silicon-dioxide nodes 314b, source conductive nodes 311d, and capacitor-node connectors 310c, respectively, and the second-type first raised field-oxide layers 321b and the first-type third raised field-oxide layers 304d in each of the trench isolation regions and the first-type third raised field-oxide layers 304d in each of the plurality of first-type STI regions are simultaneously etched back to a depth equal to a thickness of the isolation silicon-dioxide layer 314a; and subsequently, a second planarized thick-oxide layer 323a is formed between the second masking dielectric layers 305a in the common-drain regions, and the second planarized thick-oxide layers 323a together with the etched first sidewall dielectric spacers 322b are simultaneously etched back to a top surface level of the conductive-gate node 317c by using anisotropic dry etching to form an etched-back second planarized thick-oxide layer 323b between the common-drain regions. The second planarized thick-oxide layer 323a is preferably made of silicon-oxide as deposited by LPCVD, HDPCVD, or PECVD and is formed by first depositing a thick-oxide layer 323 to fill up each gap between the common-drain regions and then planarizing the deposited thick-oxide layer 323 using CMP with the second masking dielectric layer 305a as a polishing stop. It is clearly seen that a pair of vertical transistor structures are further separated in a self-aligned manner to reduce the coupling effect between the pair of vertical transistor structures.

Figure 4A:
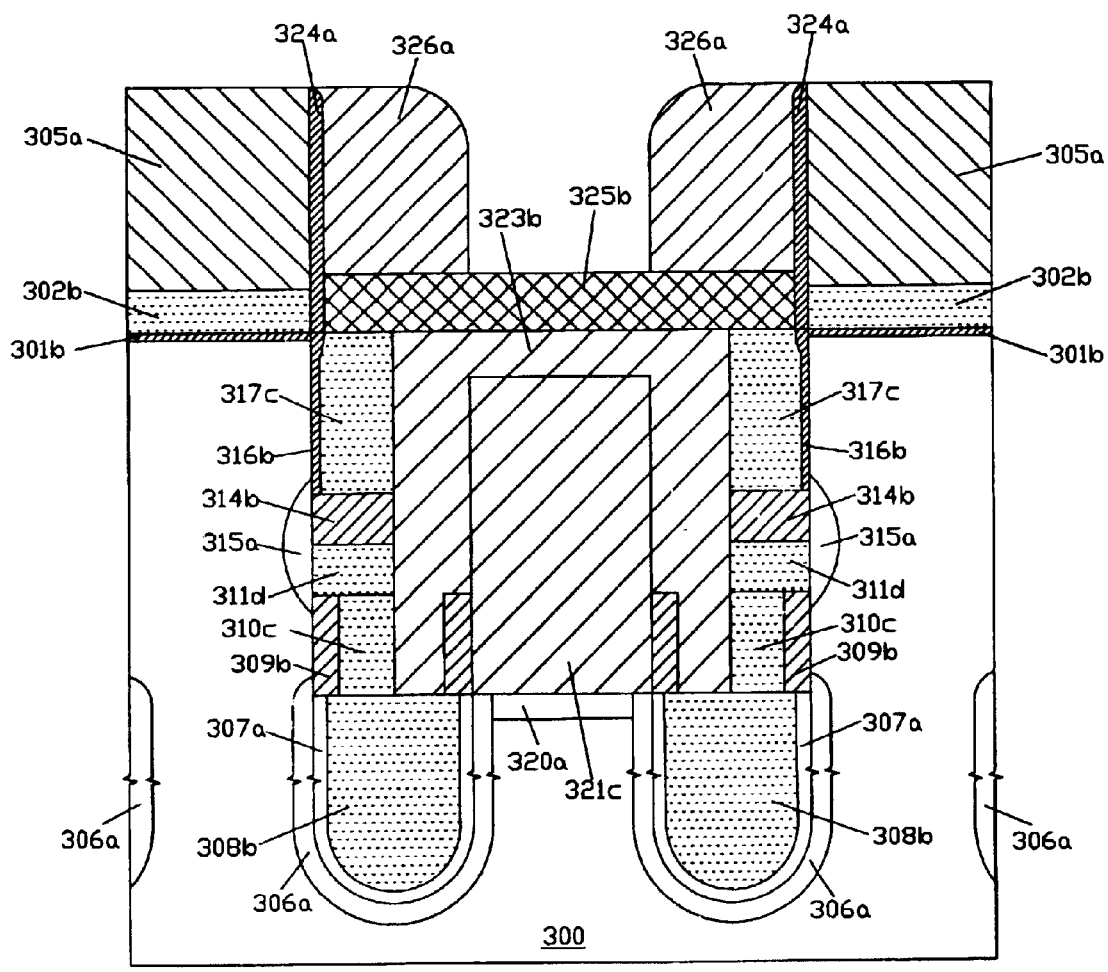
FIG. 4A through FIG. 4E show the process steps and their cross-sectional views of fabricating a first-type vertical DRAM cell structure and its first-type contactless DRAM array of the present invention after FIG. 3J.

Referring now to FIG. 4A through FIG. 4E, there are shown the process steps and their cross-sectional views of forming a first-type vertical DRAM cell structure and its first-type contactless DRAM array of the present invention after FIG. 3J. FIG. 4A shows that a pair of second sidewall dielectric spacers 324a are formed over sidewalls formed by the second masking dielectric layers 305a over the first conductive layers 302b in the common-drain regions, and a planarized capping conductive-gate layer 325b is formed between the pair of second sidewall dielectric spacers 324a; and subsequently, a pair of third sidewall dielectric spacers 326a are formed over outer sidewalls of the pair of second sidewall dielectric spacers 324a and on the planarized capping conductive-gate layer 325b. The second sidewall dielectric spacer 324a is preferably made of silicon-dioxide as deposited by LPCVD and is formed by first depositing a thin silicon-dioxide layer 324 over a formed structure surface and then etching back a thickness of the deposited thin silicon-dioxide layer 324. The planarized capping conductive-gate layer 325b is preferably made of tungsten-disilicide ($WSi_2$) or tungsten as deposited by LPCVD or sputtering and is formed by first depositing a thick conductive layer 325 to fill up each gap between the pair of second sidewall dielectric spacers 324a, then planarizing the deposited thick conductive layer 325 using CMP with the second masking dielectric layer 305a as a polishing stop, and subsequently etching back the planarized thick conductive layers 325a to a predetermined thickness. The third sidewall dielectric spacer 326a is preferably made of silicon-dioxide as deposited by LPCVD and is formed by first depositing a silicon-dioxide layer 326 and then etching back a thickness of the deposited silicon-dioxide layer 326.

Figure 4B:
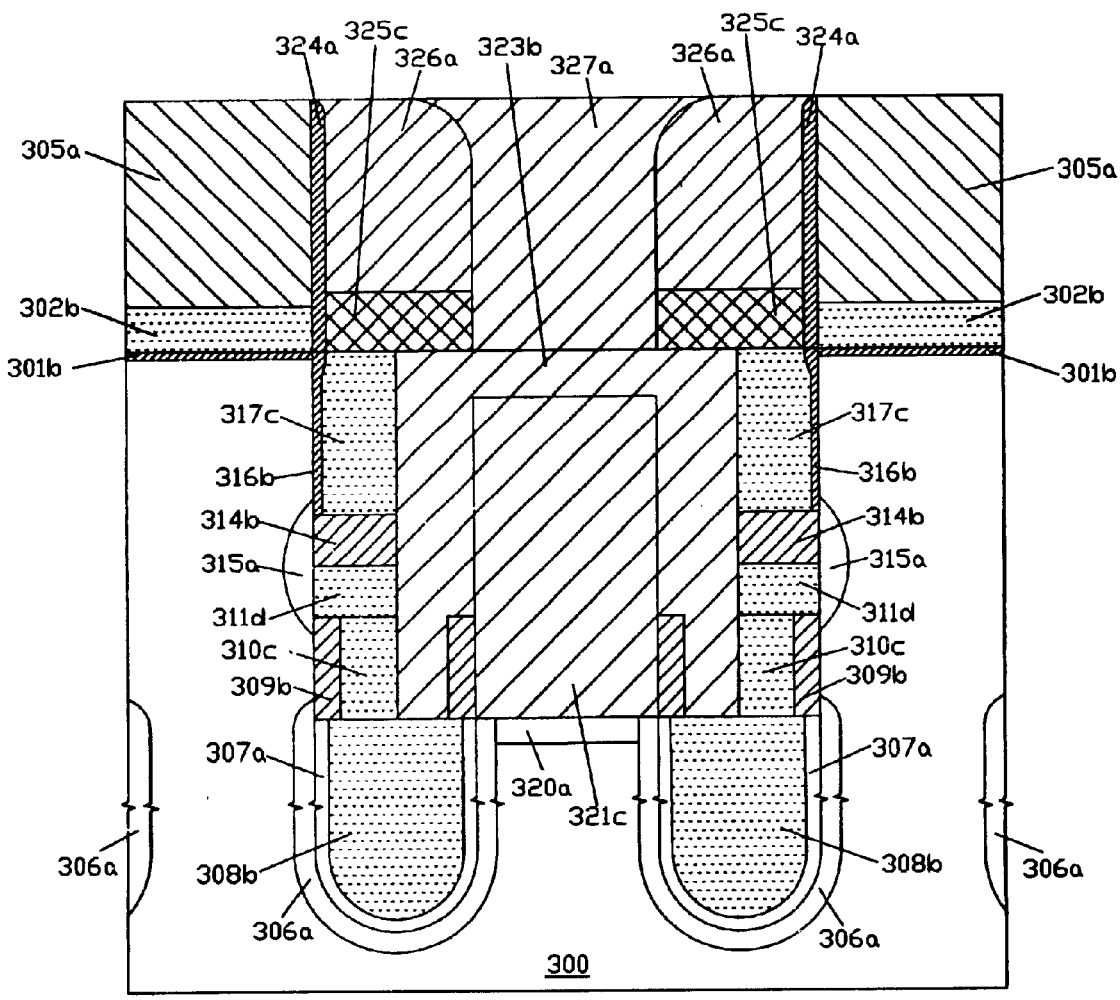

FIG. 4B shows that the planarized capping conductive-gate layers 325b between the pair of third sidewall dielectric spacers 326a are selectively removed by using anisotropic dry etching to form a pair of highly conductive word-lines 325c between the common-drain regions, and a planarized capping silicon-dioxide layer 327a is formed between the common-drain regions. The planarized capping silicon-dioxide layer 327a is preferably made of silicon-dioxide as deposited by LPCVD, HDPCVD, or PECVD. It is clearly seen that the width of the highly conductive word-line 325c can be easily controlled by the spacer width of the third sidewall dielectric spacer 326a and is adjustable.

Figure 4C:
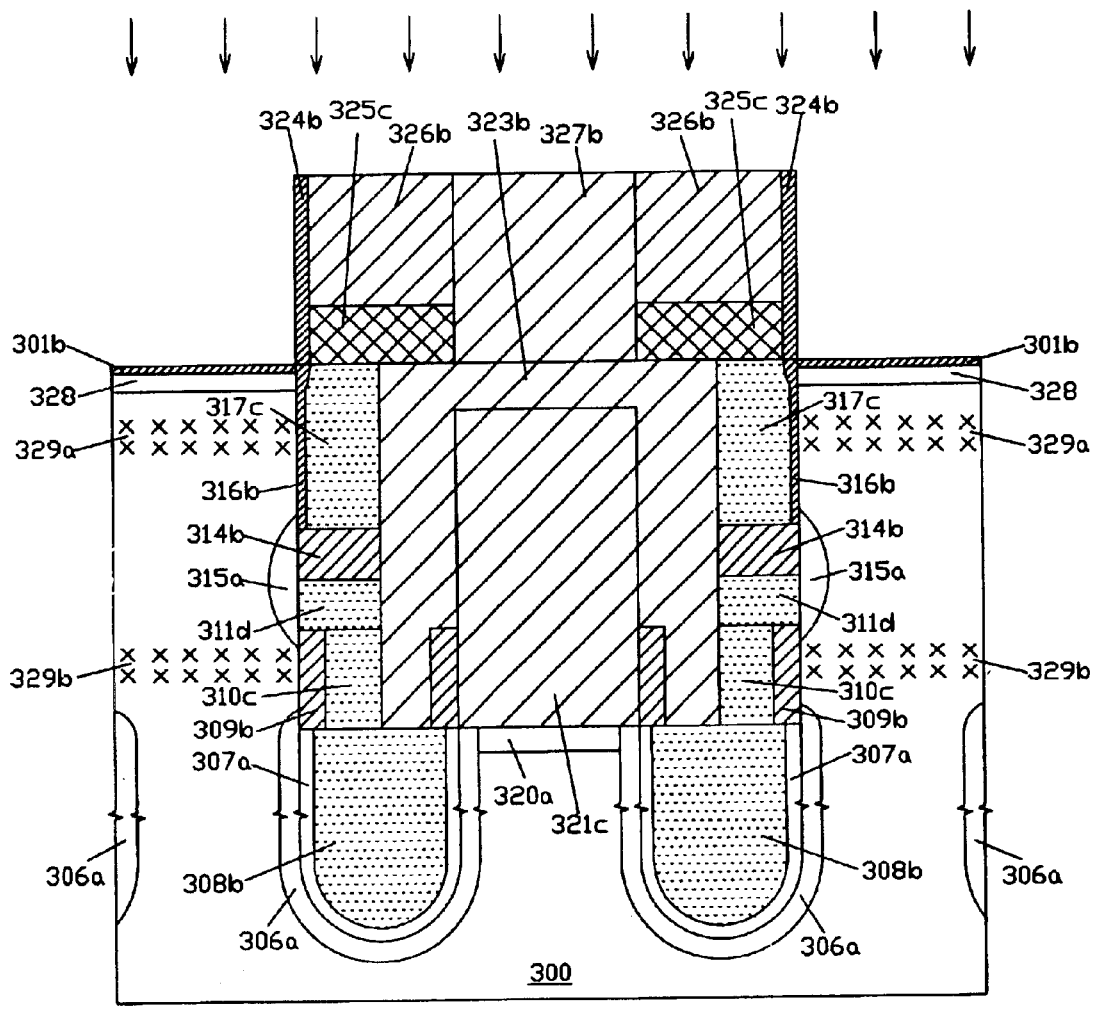

FIG. 4C shows that the second masking dielectric layers 305a over the common-drain regions are removed by hot-phosphoric acid or anisotropic dry etching; the formed structure including various silicon-dioxide layers is then etched back anisotropically to a depth equal to a thickness of the first conductive layer 302b, and the first conductive layers 302b are removed by anisotropic dry etching to form a flat surface being alternately formed by a first dielectric layer 301b and a first-type fourth raised field-oxide layer 304e; and subsequently, different implant regions can be formed in the semiconductor substrate 300 in a self-aligned manner by implanting doping impurities across the first dielectric layers 301b. The different implant regions may comprise a common-drain diffusion region 328 of the second conductivity type being formed in an upper surface region of the semiconductor substrate 300, a deep implant region 329a of the first conductivity type being formed in the semiconductor substrate 300 near a middle portion outside of the gate-dielectric layer 316b, and a deeper implant region 329b of the first conductivity type being formed in the semiconductor substrate 300 near a middle portion outside of the collar-oxide layer 309b in each of the plurality of active regions. The common-drain diffusion region 328 may comprise a shallow heavily-doped diffusion region 328b being formed within a lightly-doped diffusion region 328a. The deep implant region 329a is mainly used to form a punch-through stop and to simultaneously adjust a threshold voltage of the vertical transistor. The deeper implant region 329b is also used to form a punch-through stop and to simultaneously adjust a threshold-voltage of the parasitic collar-oxide transistor. It is clearly seen that the channel length of the vertical transistor can be shortened to obtain a lower on-resistance for high-speed read and write operation and a lower off-current for longer retention. Similarly, the separation between the common-source diffusion region 315a and the lower capacitor node 306a can be made to be smaller without concerning the punch-through effect. Accordingly, the depth of the deep trenches can be made to be shallower for the present invention as compared to the prior art.

Figure 4D:
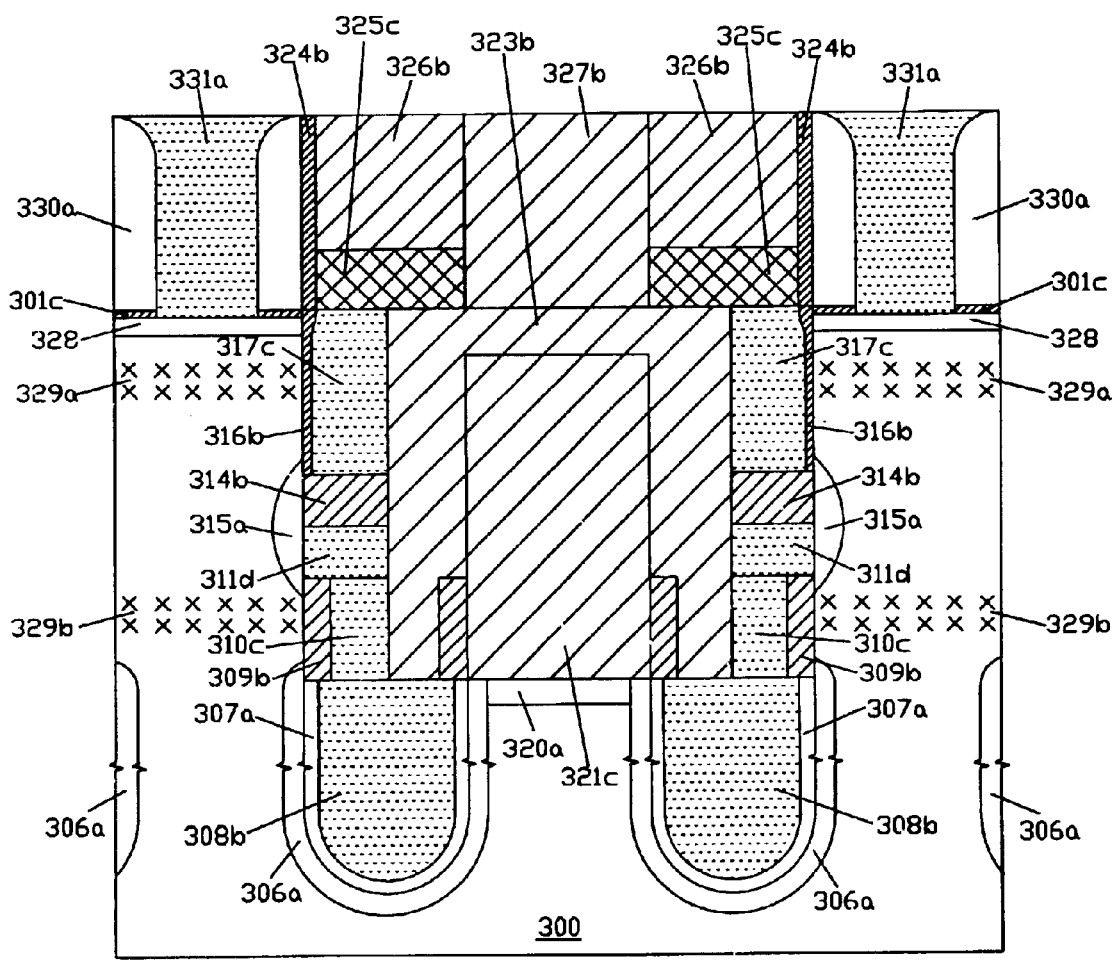

FIG. 4D shows that a pair of fourth sidewall dielectric spacers 330a are formed over outer sidewalls of nearby etched-back second sidewall dielectric spacers 324b and on a portion of the flat surface being alternately formed by the first dielectric layer 301b and the first-type fourth raised field-oxide layer 304e; the first dielectric layers 301b between the pair of fourth sidewall dielectric spacers 330a are removed by dipping in dilute hydrofluoric acid and the first-type fourth raised field-oxide layers 304e are simultaneously etched to form a flat bed being alternately formed by the common-drain diffusion region 328 and a first-type fifth raised field-oxide layer 304f; and subsequently, a planarized common-drain conductive layer 331a is formed over the flat bed between the pair of fourth sidewall dielectric spacers 330a in each of the common-drain regions. The fourth sidewall dielectric spacer 330a is preferably made of silicon-dioxide, silicon-nitride, or silicon-oxynitride. The planarized common-drain conductive layer 331a is preferably made of doped polycrystalline-silicon and is further heavily implanted with a high-dose of doping impurities of the second conductivity type. The planarized common-drain conductive layer 331a can be silicided with a refractory metal-silicide layer such as a titanium-disilicide ($TiSi_2$) or cobalt-disilicide ($CoSi_2$) layer. Similarly, the planarized common-drain conductive layer 331a may comprise a planarized tungsten layer being lined with a barrier-metal layer such as a titanium-nitride (TiN) or tantalum-nitride (TaN) layer.

Figure 4E:
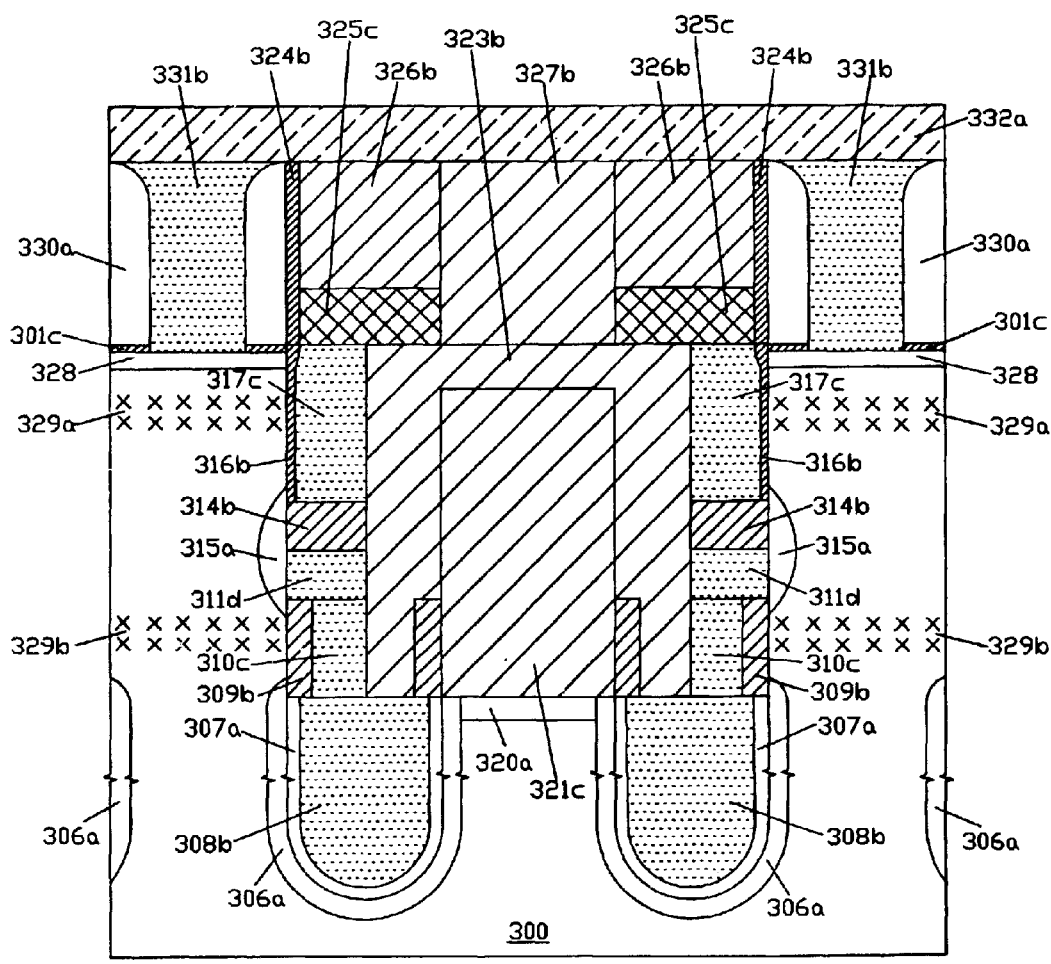

FIG. 4E shows that a metal layer 332 is formed over a formed structure surface shown in FIG. 4D; the metal layer 332 and the planarized common-drain conductive layers 331a are simultaneously patterned and etched by a masking photoresist step being aligned above the plurality of active regions to form a plurality of metal bit-lines 332a integrated with planarized common-drain conductive islands 331b. The metal layer 332 comprises an aluminum or copper layer over a barrier-metal layer. The mask photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers to eliminate misalignment. FIG. 4E shows a first-type vertical DRAM cell structure and its first-type contactless DRAM array of the present invention.

Figure 4F:
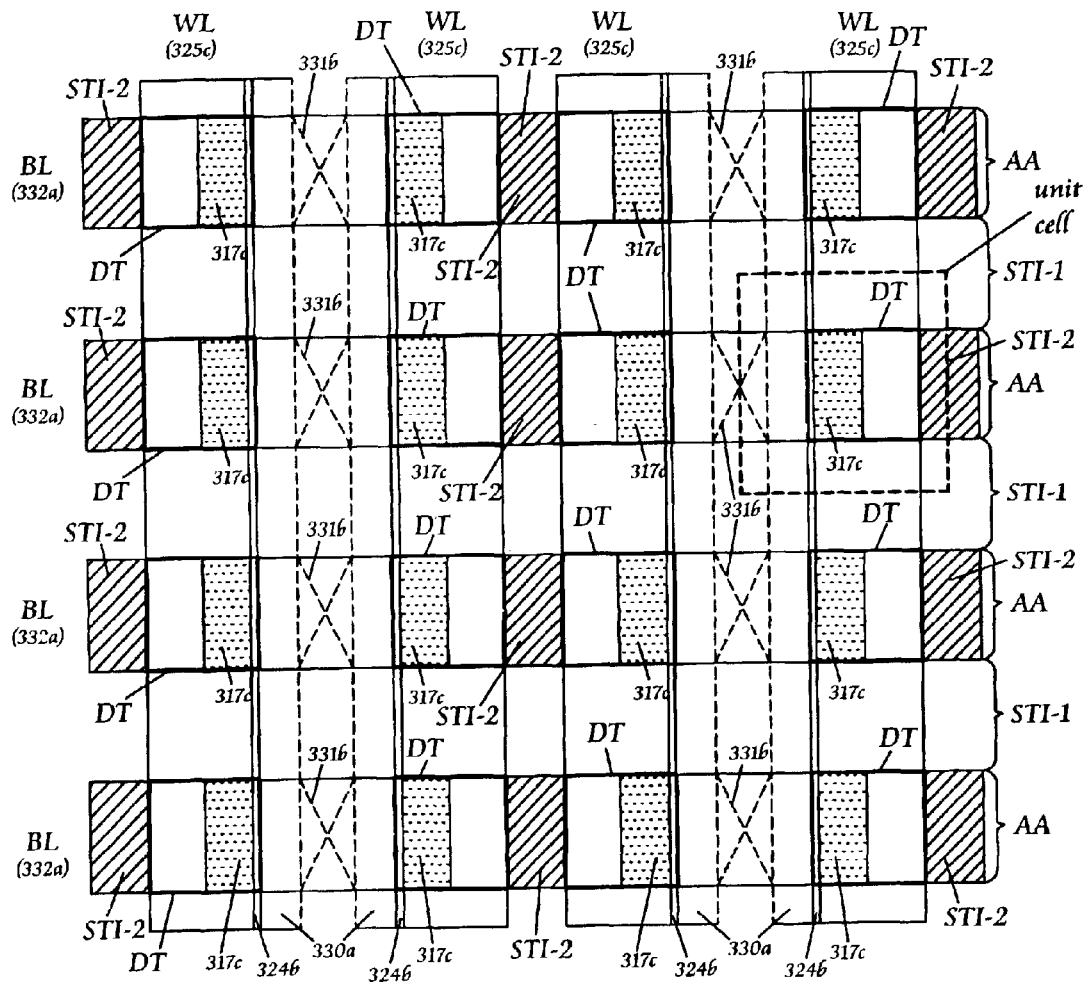
FIG. 4F shows a top plan view of a first-type contactless DRAM array of the present invention.

FIG. 4F shows a top plan view of the first-type contactless DRAM array, in which the plurality of metal bit-lines (BL) 332a integrated with the planarized common-drain conductive islands 331b are formed to be aligned above the plurality of active regions (AA), wherein the planarized common-drain conductive islands 331b are formed over the common-drain diffusion regions 328 between the pair of fourth sidewall dielectric spacers 330a; the plurality of first-type STI regions (STI-1) and the plurality of active regions (AA) are formed alternately on said semiconductor substrate 300; the plurality of conductive word-lines (WL) 325c being connected with the conductive-gate nodes 317c are defined by a pair of third sidewall dielectric spacers 326b, wherein the conductive-gate node 317c is formed in the deep trench (DT) and is patterned by a first sidewall dielectric spacer 322a; and the second-type STI region (STI-2) being filled with the second-type second raised field-oxide layer 321c is formed in the active region. From FIG. 4F, the unit cell size as marked by a dash square can be made to be equal to $4F^2$ if the size of the deep trench is equal to $1F^2$.

Referring now to FIG. 5A through FIG. 5F, there are shown the process steps and their cross-sectional views for forming a second-type vertical DRAM cell structure and its second-type contactless DRAM array after FIG. 3J.

Figure 5A:
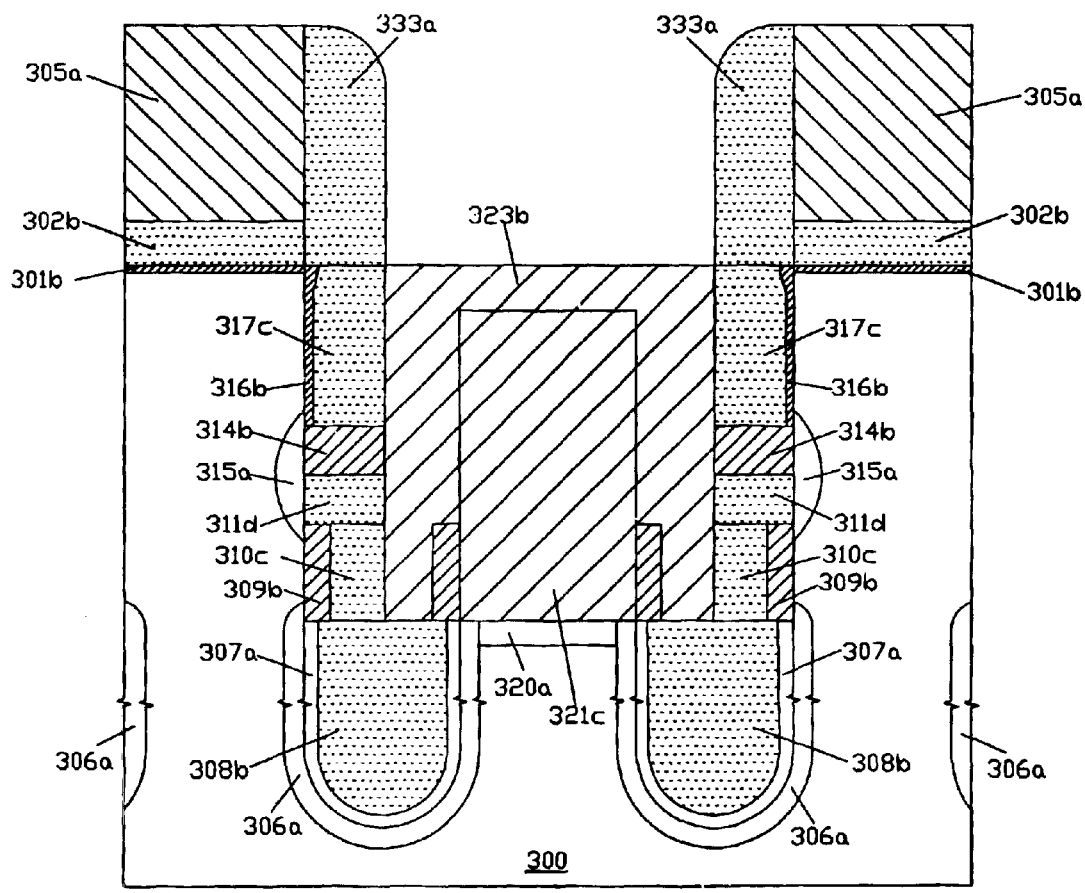
FIG. 5A through FIG. 5F show the process steps and their cross-sectional views of fabricating a second-type vertical DRAM cell structure and its second-type contactless DRAM array of the present invention after FIG. 3J.

FIG. 5A shows that a pair of sidewall conductive spacers 333a are formed over outer sidewalls formed by the second masking dielectric layers 305a over the first conductive layers 302b as shown in FIG. 3J. The sidewall conductive spacer 333a is preferably made of doped polycrystalline-silicon as deposited by LPCVD and is formed by first depositing a doped polycrystalline-silicon layer 333 over a formed structure surface and then etching back a thickness of the deposited doped polycrystalline-silicon layer 333. It should be noted that the sidewall conductive spacer 333a can be made of tungsten-disilicide or tungsten as deposited by LPCVD or sputtering. As shown in FIG. 5A, the sidewall conductive spacer 333a is preferably aligned to the edge of the conductive-gate node 317c.

Figure 5B:
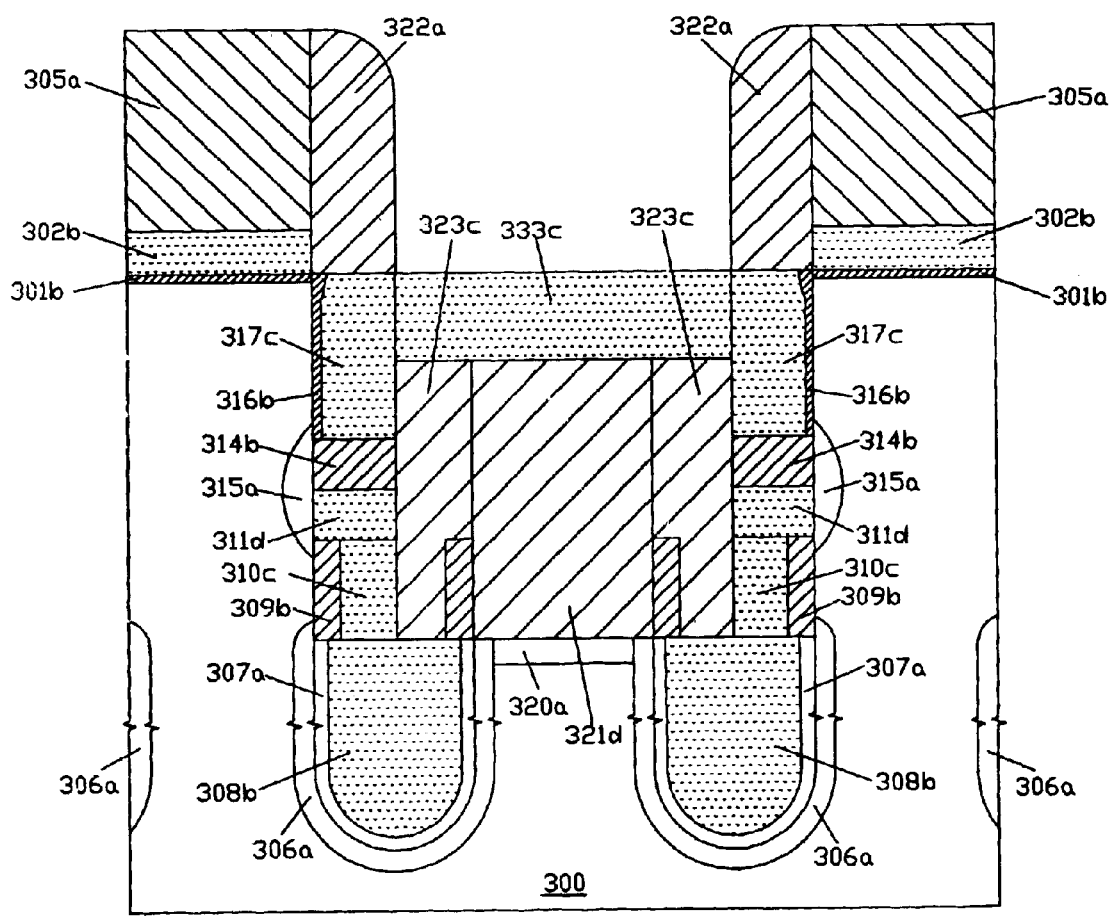

FIG. 5B shows that the etched-back second planarized thick-oxide layers 323b, the second-type second raised field-oxide layer 321c, and the first-type third raised field-oxide layers 304d between the pair of conductive sidewall spacers 333a are simultaneously etched by anisotropic dry etching to a depth approximately equal to a half height of the conductive-gate node 317c, and a planarized thick conductive layer 333b is then formed between the pair of sidewall conductive spacers 333a, and the pair of sidewall conductive spacers 333a and the planarized thick conductive layers 333b are etched back to a top surface level of the conductive-gate node 317c to form a planarized conductive-gate connector 333c between the pair of conductive-gate nodes 317c; and subsequently, a pair of first sidewall dielectric spacers 322a are again formed over sidewalls formed by the second masking dielectric layers 305a over the first conductive layers 302b. The planarized conductive-gate connector 333c is preferably made of the same material as the pair of sidewall conductive spacers 333a. If the planarized conductive-gate connector 333c is made of doped polycrystalline-silicon, an ion-implantation (not shown) can be performed in a self-aligned manner by implanting a high dose of doping impurities of the second conductivity type into the planarized conductive-gate connector 333c.

Figure 5C:
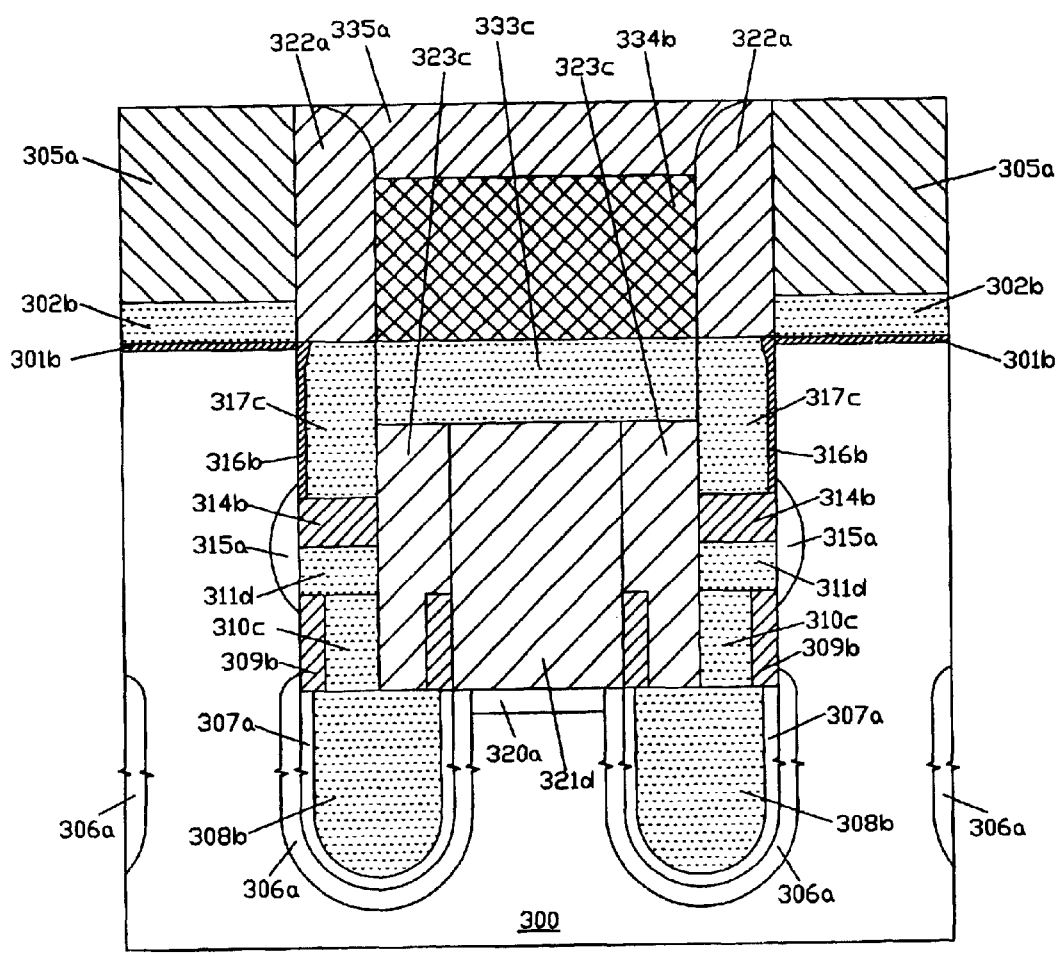

FIG. 5C shows that a planarized common-gate conductive layer 334b is formed between the pair of first sidewall dielectric spacers 322a and on a planarized conductive-gate connector 333c, and a planarized capping-oxide layer 335a is formed over the planarized common-gate conductive layer 334b between the pair of first sidewall dielectric spacers 322a. The planarized common-gate conductive layer 334b comprises a tungsten (W) or tungsten-disilicide ($WSi_2$) layer as deposited by LPCVD or sputtering and is formed by first depositing a thick conductive layer 334 to fill up each gap between the pair of first sidewall dielectric spacers 322a, then planarizing the deposited thick conductive layer 334 using CMP to form a planarized conductive layer 334a, and etching back said planarized conductive layer 334a to a depth larger than a thickness of the first conductive layer 302b. The planarized capping oxide layer 335a is preferably made of silicon-dioxide, P-glass, or BP-glass as deposited by LPCVD, HDPCVD, or PECVD, and is formed by first depositing a capping-oxide layer 335 and then planarizing the deposited capping-oxide layer 335 using CMP with the second masking dielectric layer 305a as a polishing stop.

Figure 5D:
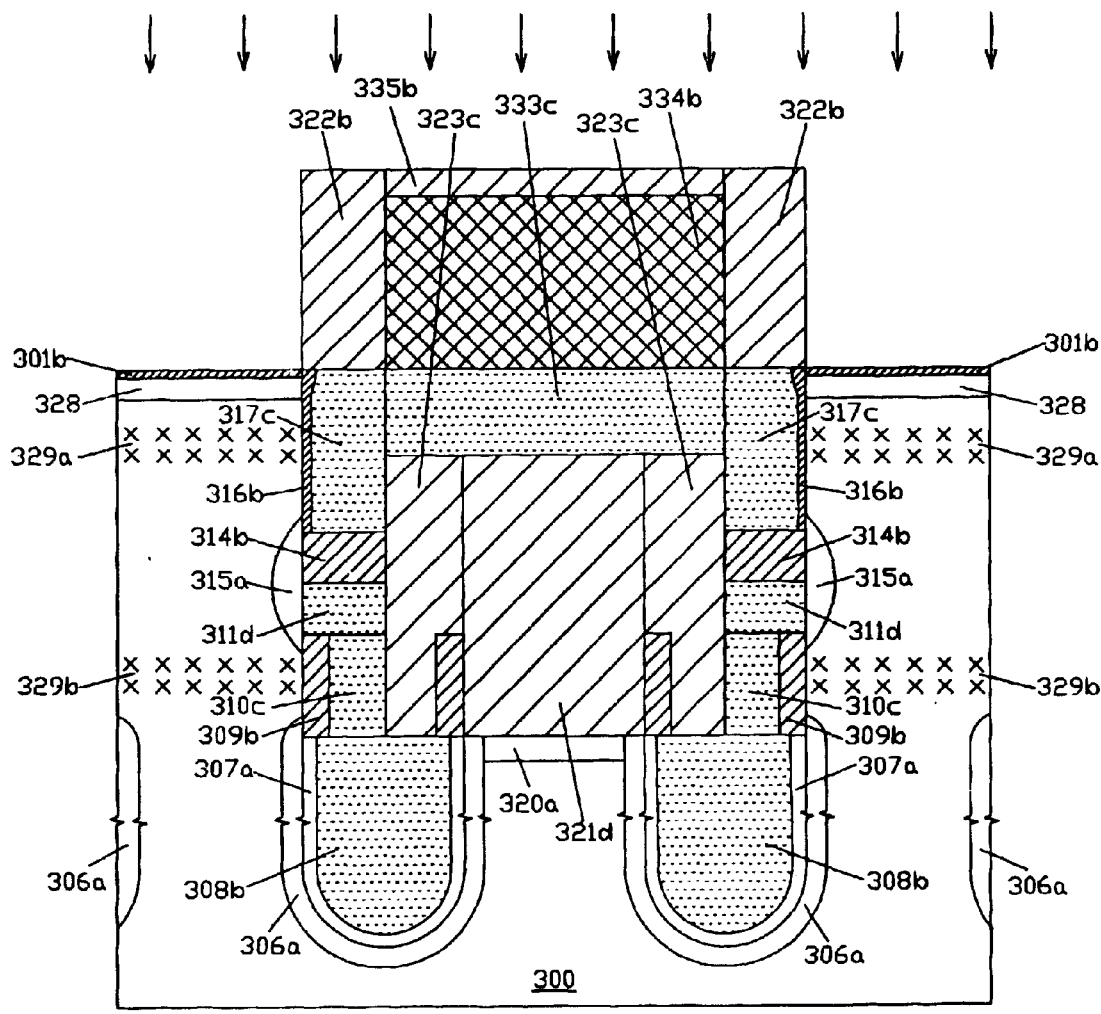

FIG. 5D shows that the second masking dielectric layers 305a in the common-drain regions are selectively removed by hot-phosphoric acid or anisotropic dry etching and an etching-back process is performed to anisotropically etch the first-type first raised field-oxide layers 304b, the pair of first sidewall dielectric spacers 322a, and the planarized capping-oxide layers 335a to a depth equal to a thickness of the first conductive layer 302b, and the first conductive layers 302b are then removed to form a flat surface being alternately formed by the first dielectric layer 301b and a first-type fourth raised field-oxide layer 304e; and subsequently, different implant regions are formed in the semiconductor substrate 300 of each of the plurality of active regions in each of the common-drain regions. The different implant regions may comprise a common-drain diffusion region 328 of the second conductivity type being formed in an upper surface portion of the semiconductor substrate 300, a deep implant region 329a of the first conductivity type being formed in the semiconductor substrate 300 near a middle portion outside of the gate-dielectric layer 316b, and a deeper implant region 329b of the first conductivity type being formed in the semiconductor substrate 300 near a middle portion outside of the collar-oxide layer 309b. The common-drain diffusion region 328 may comprise a shallow heavily-doped diffusion region 328b being formed within a lightly-doped diffusion region 328a.

Figure 5E:
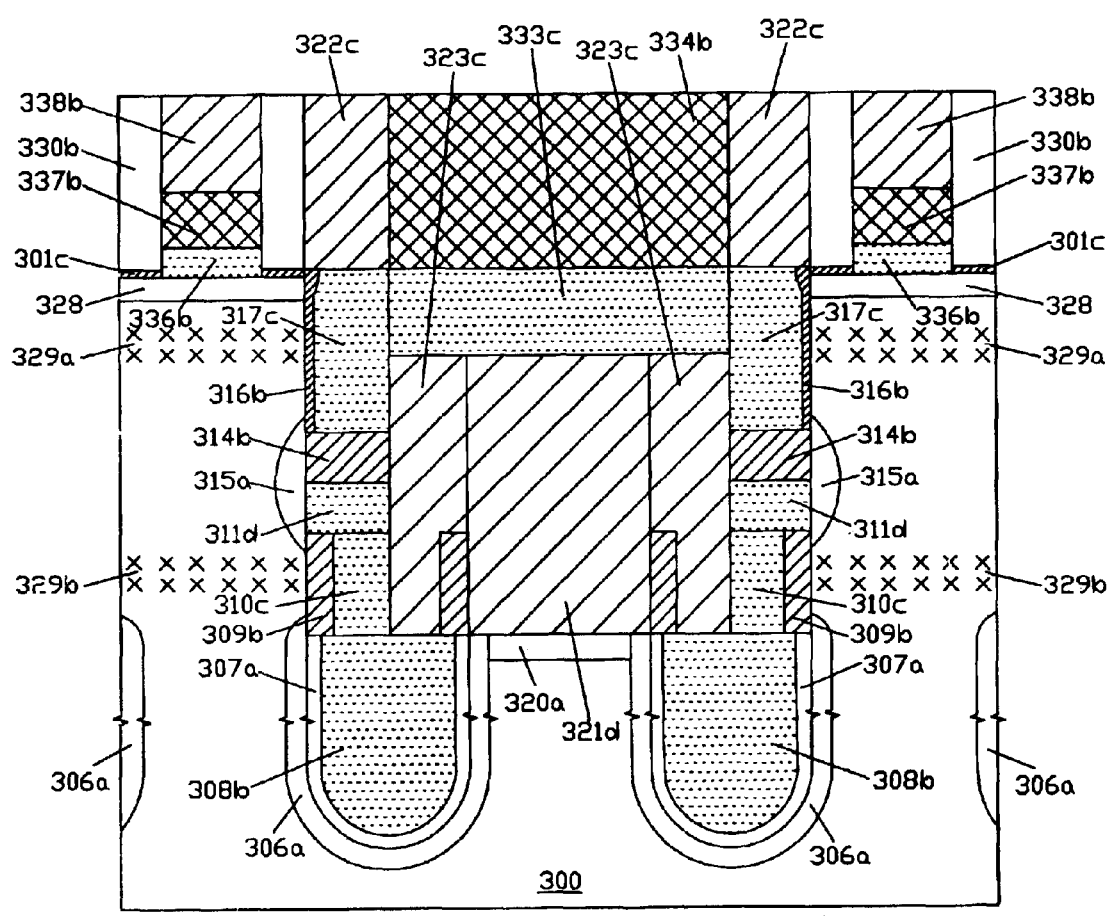

FIG. 5E shows that a pair of fourth sidewall dielectric spacers 330a are formed over each sidewall of nearby etched-back first sidewall dielectric spacers 322b; the first dielectric layers 301b between the pair of fourth sidewall dielectric spacers 330a are removed by dipping in dilute hydrofluoric acid or anisotropic dry etching, and the first-type fourth raised field-oxide layers 304e are simultaneously etched to form a flat bed between the pair of fourth sidewall dielectric spacers 330a in each of the common-drain regions; a doped polycrystalline-silicon layer 336b capped with a tungsten-disilicide ($WSi_2$) or tungsten (W) layer 337b or silicided with a refractory metal-silicide layer 337b such as a titanium-disilicide ($TiSi_2$) or cobalt-disilicide ($CoSi_2$) layer is formed over the flat bed to act as a common-drain conductive bit-line 337b/336b; a third planarized thick-oxide layer 338a is formed over the common-drain conductive bit-line 337b/336b in each of the common-drain regions; the formed structure is then etched back to a depth equal to a thickness of the etched-back planarized capping-oxide layer 335b. The fourth sidewall dielectric spacer 330a is preferably made of silicon-dioxide as deposited by LPCVD. The third planarized thick-oxide layer 338a is preferably made of silicon-dioxide, P-glass, or BP-glass as deposited by LPCVD, HDPCVD or PECVD. The doped polycrystalline-silicon layer 336b is preferably deposited by LPCVD and is further implanted with a high-dose of doping impurities of the second conductivity type.

Figure 5F:
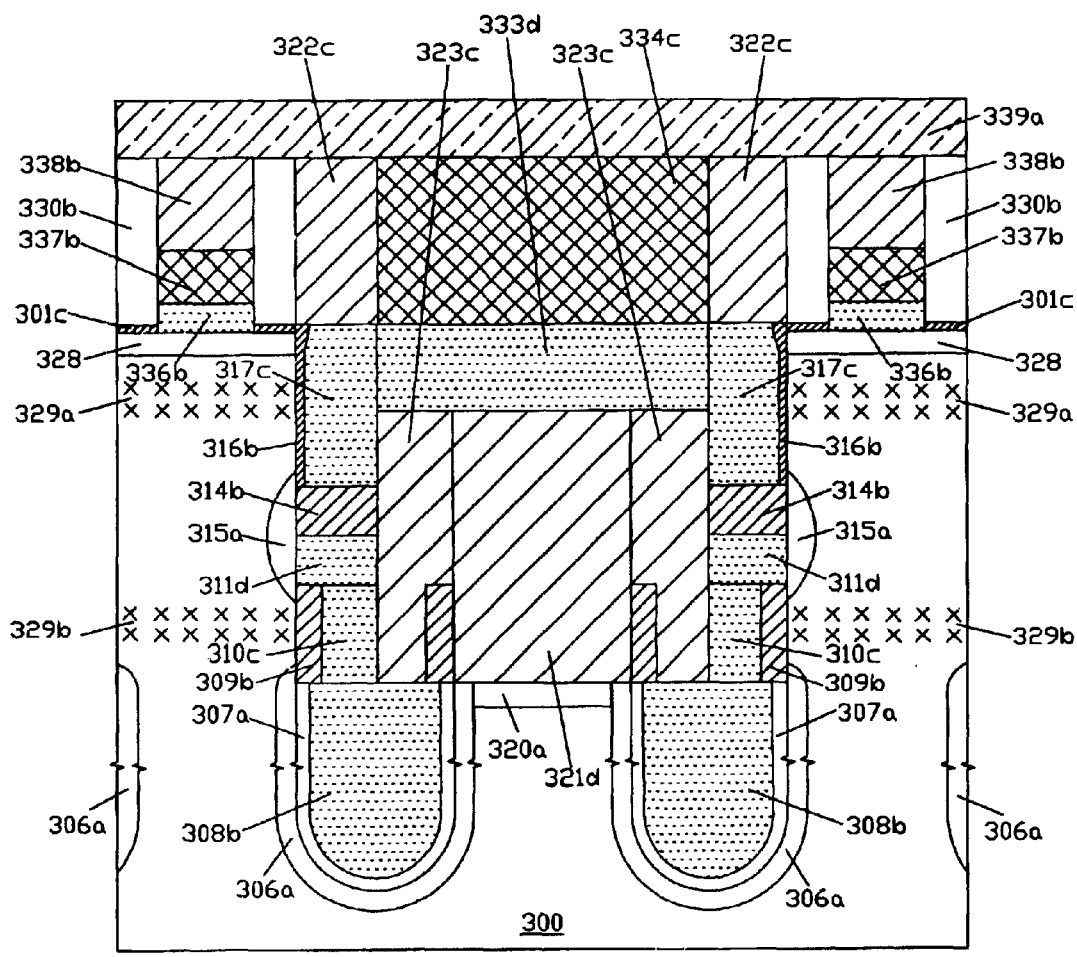

FIG. 5F shows that a metal layer 339 is formed over a formed structure surface as shown in FIG. 5E and a metal layer 339 together with the planarized common-gate conductive layers 334b over the planarized conductive-gate connectors 333c are simultaneously patterned by a masking photoresist step to form the plurality of metal word-lines 339a integrated with planarized common-gate conductive islands 334c over planarized conductive-gate connector islands 333d. The metal layer 339 may comprise an aluminum or copper layer over a barrier-metal layer such as a titanium-nitride (TiN) or tantalum-nitride (TaN) layer.

Figure 5G:
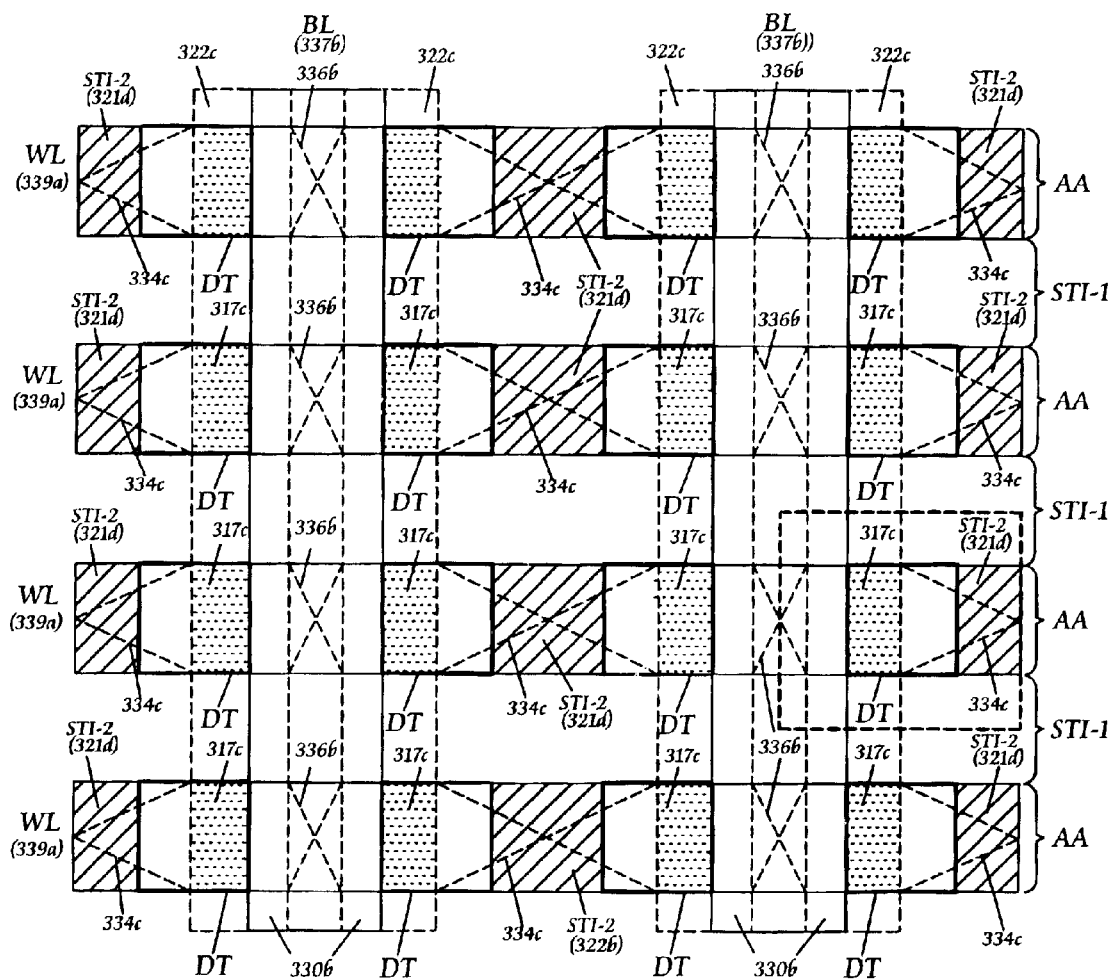
FIG. 5G shows a top plan view of a second-type contactless DRAM array of the present invention.

FIG. 5G shows a top plan view of a second-type contactless DRAM array of the present invention, in which the plurality of metal word-lines (WL) 339a integrated with the planarized common-gate conductive islands 334c over the planarized conductive-gate connector islands 333d are formed to be aligned above the plurality of active regions (AA); each of the plurality of conductive bit-lines (BL) 337b over the heavily-doped polycrystalline-silicon layer 336b being formed between the pair of fourth sidewall dielectric spacers 330b is formed over the flat bed being alternately formed by the common-drain diffusion region 328 and the first-type fifth raised field-oxide layer 304f; the plurality of first-type STI regions (STI-1) and the plurality of active regions (AA) are formed alternately on the semiconductor substrate 300; each of the plurality of deep trenches (DT) is partially filled with the conductive-gate node 317c; the second-type STI region (STI-2) is formed between the pair of deep-trenches (DT); and the pair of first sidewall dielectric spacers 322c are formed over each sidewall of nearby common-drain regions to define the planarized common-gate conductive islands 334c being formed over the planarized conductive-gate connector islands 333d connected with a portion of nearby conductive-gate nodes 317c. Similarly, a cell size of the second-type vertical DRAM cell structure as marked by a dash square can be made to be equal to $4F^2$ if the deep-trench size is $1F^2$.

Accordingly, the advantages and the features of a vertical DRAM cell structure and its contactless DARM arrays of the present invention are summarized as below:

(a) The vertical DRAM cell structure of the present invention may offer a DRAM cell size of $4F^2$.

(b) The vertical DRAM cell structure of the present invention can be fabricated with less masking photoresist steps to reduce the cost of manufacturing.

(c) The vertical DRAM cell structure of the present invention can be fabricated by using a shallower depth of the deep trenches by decreasing the gate length of the vertical transistor and the separation length of the collar-oxide layer through self-aligned ion-implantations.

(d) The vertical DRAM cell structure of the present invention offers the second-type STI regions with a depth approximately equal to a bottom surface level of the collar-oxide layer for nearby vertical DRAM cells to reduce the possible coupling effects between the nearby vertical DRAM cells.

(e) The first-type contactless DRAM array of the present invention offers the plurality of metal bit-lines integrated with the planarized common-drain conductive islands and the plurality of conductive word-lines for obtaining high-speed read and write operations.

(f) The second-type contactless DRAM array of the present invention offers the plurality of metal word-lines integrated with the planarized common-gate conductive islands over the planarized conductive-gate connector islands and the plurality of conductive bit-lines for obtaining high-speed read and write operations.

While the present invention has been particularly shown and described with references to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claimed is:

1. A vertical DRAM cell structure, comprising:

a semiconductor substrate of a first conductivity type having an active region and two first-type shallow-trench-isolation (STI) regions, wherein said active region is located between said two first-type STI regions;

a DRAM cell comprising a trench region, a trench isolation region, and a common-drain region being formed on said semiconductor substrate, wherein said trench region being located between said common-drain region and said trench isolation region comprises a deep-trench region being located in said active region and said trench isolation region comprises a second-type STI region outside of said deep-trench region being located in said active region;

said two first-type STI regions comprising two first-type raised field-oxide layers;

said second-type STI region comprising a second-type raised field-oxide layers;

said deep-trench region comprising: a trench capacitor being formed in a lower portion of a deep trench, a collar-oxide layer together with a capacitor-node connector being formed in a middle portion of said deep trench, and a vertical transistor region being formed in an upper portion of said deep trench;

said trench capacitor comprising an upper capacitor node being formed over a capacitor-dielectric layer and said capacitor-dielectric layer being formed over a lower capacitor node in said semiconductor substrate;

said vertical transistor region comprising a gate-dielectric layer over a portion of a sidewall of said deep trench together with a conductive-gate node being formed over an isolation silicon-dioxide node, said isolation silicon-dioxide node being formed over a source conductive node, and said source conductive node being formed over said capacitor-node connector and said collar-oxide layer, wherein said conductive-gate node, said isolation silicon-dioxide node, said source conductive node, and said capacitor-node connector are patterned by a first sidewall dielectric spacer being formed over an outer sidewall of said common-drain region; and said common-drain region being located in a side portion of said trench region comprising: a common-drain diffusion region of a second conductivity type being formed in an upper surface portion of said semiconductor substrate of said active region, a fourth sidewall dielectric spacer being formed over an outer sidewall of said trench region, and a flat bed located outside of said fourth sidewall dielectric spacer being formed by said common-drain diffusion region in said active region and two first-type fifth raised field-oxide layers in said two first-type STI regions, wherein said active region under said common-drain diffusion region comprises a deep implant region of said first conductivity type being formed in said semiconductor substrate near a middle portion outside of said gate-dielectric layer, a common-source diffusion region of said second conductivity type being formed in said semiconductor substrate near an outside portion of said source conductive node, and a deeper implant region of said first conductivity type being formed in said semiconductor substrate near a middle portion outside of said collar-oxide layer.

2. The vertical DRAM cell structure according to claim 1, wherein a planarized common-drain conductive island is formed over said common-drain diffusion region outside of said fourth sidewall dielectric spacer and a metal bit-line integrated with said planarized common-drain conductive island are simultaneously patterned by a masking photoresist step being aligned above said active region for forming a first-type vertical DRAM cell.

3. The vertical DRAM cell structure according to claim 1, wherein a common-drain conductive bus-line being acted as a conductive bit line is formed over said flat bed outside of said fourth sidewall dielectric spacer and an etched-back third planarized thick-oxide layer is formed over said common-drain conductive bus-line for forming a second-type vertical DRAM cell.

4. The vertical DRAM cell structure according to claim 1, wherein a planarized capping conductive-gate layer acted as a conductive word-line being defined by a third sidewall dielectric spacer is formed outside of a second sidewall dielectric spacer and over said conductive-gate node in said deep trench, two first-type third raised field-oxide layers in said two first-type STI regions, and a portion of an etched-back second planarized thick-oxide layer outside of said conductive-gate node for forming a first-type vertical DRAM cell.

5. The vertical DRAM cell structure according to claim 1, wherein a planarized common-gate conductive island being formed outside of a first sidewall dielectric spacer is formed over a planarized conductive-gate connector island being connected with a portion of a side surface of said conductive-gate node in said deep trench and a metal word-line integrated with said planarized common-gate conductive island over said planarized conductive-gate connector island are simultaneously patterned by a masking photoresist step being aligned above said active region for forming a second-type vertical DRAM cell.

6. The vertical DRAM cell structure according to claim 1, wherein a bottom surface level of said second-type second raised field-oxide layer is approximately equal to that of said collar-oxide layer and a heavily-implanted region of said second conductivity type being formed under said second-type second raised field-oxide layer is connected with said lower capacitor node being formed by a heavily-doped diffusion region of said second conductivity type.

7. A contactless DRAM array, comprising:
- a semiconductor substrate of a first conductivity type having a plurality of active regions and a plurality of first-type shallow-trench-isolation (STI) regions formed alternately;
- a plurality of trench regions being formed alternately on said. semiconductor substrate and transversely to the plurality of active regions, wherein each of the plurality of trench regions being located between a common-drain region and a trench isolation region comprises a plurality of deep-trench regions being formed in the plurality of active regions and said trench isolation region comprises a plurality of second-type STI regions being formed between the plurality of deep-trench regions in the plurality of active regions;
- each of the plurality of first-type STI regions comprising a first-type raised field-oxide layers;
- each of the plurality of second-type STI regions comprising a second-type raised field-oxide layer;
- each of the plurality of deep-trench regions comprising: a trench capacitor being formed in a lower portion of a deep trench, a collar-oxide layer together with a capacitor-node connector being formed in a middle portion of said deep trench, and a vertical transistor region being formed in an upper portion of said deep trench;
- said trench capacitor comprising an upper capacitor node being formed over a capacitor-dielectric layer and said capacitor-dielectric layer being formed over a lower capacitor node in said semiconductor substrate;
- said vertical transistor region comprising a gate-dielectric layer over a portion of a sidewall of said deep trench together with a conductive-gate node being formed over an isolation silicon-dioxide node, said isolation silicon-dioxide node being formed over a source conductive node, and said source conductive node being formed over said capacitor-node connector and said collar-oxide layer, wherein said conductive-gate node, said isolation silicon-dioxide node, said source conductive node, and said capacitor-node connector are patterned by a first sidewall dielectric spacer being formed over an outer sidewall of said common-drain region; and
- said common-drain region comprising: a common-drain diffusion region of a second conductivity type being formed in an upper portion of said semiconductor substrate in each of the plurality of active regions, a pair of fourth sidewall dielectric spacers being formed over outer sidewalls of nearby trench regions, and a flat bed located between said pair of fourth sidewall dielectric spacers being formed alternately by said common-drain diffusion region in said active region and a first-type fifth raised field-oxide layer in said first-type STI region, wherein said active region under said common-drain diffusion region comprises a deep implant region of said first conductivity type being formed in said semiconductor substrate near a middle portion outside of said gate-dielectric layer, a common-source diffusion region of said second conductivity type being formed in said semiconductor substrate near an outer portion of said source conductive node, and a deeper implant region of said first conductivity type being formed in said semiconductor substrate near a middle portion outside of said collar-oxide layer.

8. The contactless DRAM array according to claim 7, wherein a plurality of planarized common-drain conductive islands are formed over said common-drain diffusion regions between said pair of fourth sidewall dielectric. spacers and a plurality of metal bit-lines integrated with said planarized common-drain conductive islands are simultaneously patterned by a masking photoresist step being aligned above the plurality of active regions for forming a first-type contactless DRAM array.

9. The contactless DRAM array according to claim 7, wherein a common-drain conductive bus-line being acted as a conductive bit-line is formed over said flat bed between said pair of fourth sidewall dielectric spacers and an etched-back third planarized thick-oxide layer is formed over each of said common-drain conductive bus-lines for forming a second-type contactless DRAM array.

10. The contactless DRAM array according to claim 7, wherein a planarized capping conductive-gate layer being defined by a third sidewall dielectric spacer and is formed outside of a second sidewall dielectric spacer to act as a conductive word-line over a portion of a flat surface being alternately formed by said conductive-gate node in said deep trench, a first-type third raised field-oxide layer in said first-type STI region, and an etched-back second planarized thick-oxide layer between said conductive-gate nodes for forming a first-type contactless DRAM array.

11. The contactless DRAM array according to claim 7, wherein planarized common-gate conductive islands are formed between a pair of first sidewall dielectric spacers and on planarized conductive-gate connector islands being connected with a portion of each side surface of said conductive-gate nodes in the plurality of deep-trench regions and a plurality of metal word-lines integrated with said planarized common-gate conductive islands over said planarized conductive-gate connector islands are simultaneously patterned by a masking photoresist step being aligned above the plurality of active regions for forming a second-type contactless DRAM array.

12. The contactless DRAM array according to claim 7, wherein a bottom surface level of said second-type second raised field-oxide layer is approximately equal to that of said collar-oxide layer and a heavily-implanted region of said second conductivity type being formed under each of said second-type second raised field-oxide layers is connected with said lower capacitor nodes being formed by heavily-doped diffusion regions of said second conductivity type.

13. A method of forming a contactless DRAM array, comprising the steps of:
- providing a semiconductor substrate of a first conductivity type;
- forming a shallow-trench-isolation (STI) structure having a plurality of active regions and a plurality of first-type STI regions formed alternately on said semiconductor substrate, wherein each of the plurality of active regions comprises a first conductive layer over a first dielectric layer and each of the plurality of first-type STI regions comprises a first-type first raised field-oxide layer;
- forming a second masking dielectric layer over said STI structure and patterning said second masking dielectric layer to form a plurality of trench regions alternately and transversely to the plurality of active regions, wherein each of the plurality of trench regions is located between a common-drain region and a trench isolation region;
- removing selectively said second masking dielectric layer to form the plurality of trench regions;
- removing selectively said first conductive layers and said first dielectric layers in sequence and simultaneously etching said first-type first raised field-oxide layers to form first-type second raised field-oxide layers;
- etching anisotropically said semiconductor substrate to form a plurality of deep trenches in each of the plurality of trench regions;
- forming sequentially a trench capacitor in a lower portion of said deep trench, a collar-oxide layer together with a capacitor-node connector layer in a middle portion of said deep trench, and a vertical transistor region in an upper portion of said deep trench, wherein said trench capacitor comprises an upper capacitor node being formed over a capacitor-dielectric layer and said capacitor-dielectric layer being formed over a lower capacitor node and said vertical transistor region comprises a source conductive layer being formed over said collar-oxide layer and said capacitor-node connector layer, an isolation silicon-dioxide layer being formed over said source conductive layer, and a gate-dielectric layer over a portion of a sidewall of said deep trench together with a conductive-gate layer being formed over said isolation silicon-dioxide layer;

forming a protective silicon-dioxide layer over a formed structure surface and implanting a high dose of doing impurities of a second conductivity type across said protective silicon-dioxide layer into said conductive-gate layers in a self-aligned manner;

depositing a thick silicon-dioxide film to fill up each gap between said protective silicon-dioxide layer and planarizing said thick silicon-dioxide film and said protective silicon-dioxide layer to form a first planarized thick-oxide layer lined with an etched protective silicon-dioxide layer in each of the plurality of trench regions;

forming a plurality of masking photoresist (PR3) over said common-drain regions and a portion of the plurality of trench regions;

removing sequentially said second masking dielectric layer, said first conductive layers, and said first dielectric layers in each of said trench isolation regions and etching anisotropically said semiconductor substrate to form second-type shallow trenches in each of said trench isolation regions;

forming a second-type planarized field-oxide layer over each gap in each of said trench isolation regions and etching back selectively said first planarized thick-oxide layer and said etched protective silicon-dioxide layer in each of the plurality of trench regions and said second-type planarized field-oxide layer and said first-type second raised field-oxide layers in each of said trench isolation regions to a top surface of said conductive-gate layer;

forming a pair of first sidewall dielectric spacers over outer sidewalls of nearby common-drain regions and on a portion of a flat surface being alternately formed by said conductive-gate layer and a first-type third raised field-oxide layer between said nearby common-drain regions;

removing sequentially said conductive-gate layers, said isolation silicon-dioxide layers, said source conductive layers, and said capacitor-node connector layers between said pair of first sidewall dielectric spacers to form conductive-gate node, isolation silicon-dioxide node, source conductive node, and capacitor-node connector in each of the plurality of deep-trenches;

forming a second planarized thick-oxide layer to fill up each gap between said nearby common-drain regions and etching back said second planarized thick-oxide layers and said pair of first sidewall dielectric spacers to a top surface level of said conductive-gate nodes;

forming a plurality of metal/conductive bit-lines and a plurality of conductive/metal word-lines to form said contactless DRAM array.

14. The method of claim 13, wherein the plurality of metal bit-lines and the plurality of conductive word-lines of said contactless DRAM array are formed by the steps comprising:

forming a pair of second sidewall dielectric spacers over outer sidewalls of said nearby common-drain regions;

forming a planarized conductive layer over each gap between said pair of second sidewall dielectric spacers and etching back said planarized conductive layer to a predetermined thickness to form a planarized capping conductive-gate layer over a flat surface being alternately formed by said conductive-gate node in said deep trench, a first-type third raised field-oxide layer in said first-type STI region, and an etched-back second planarized thick-oxide layer between said conductive-gate nodes;

forming a pair of third sidewall dielectric spacers over outer sidewalls of said pair of second sidewall dielectric spacers and on a portion of said planarized capping conductive-gate layer to define a pair of highly conductive word-lines between said nearby common-drain regions;

removing selectively said planarized capping conductive-gate layer between said pair of third sidewall dielectric spacers to form said pair of highly conductive word-lines transversely to the plurality of active regions;

forming a planarized capping silicon-dioxide layer over each gap between said pair of third sidewall dielectric spacers;

removing selectively said second masking dielectric layer in each of said common-drain regions and subsequently etching back anisotropically said first-type first raised field-oxide layers in each of said common-drain regions, said second sidewall dielectric spacer and said third sidewall dielectric spacer in each of the plurality of trench regions, and said planarized capping silicon-dioxide layer in each of said trench isolation regions to a depth equal to a thickness of said first conductive layer to form first-type fourth raised field-oxide layers, etched-back second sidewall dielectric spacers and etched-back third sidewall silicon-dioxide spacers, and etched-back planarized capping silicon-dioxide layers, respectively;

removing selectively said first conductive layers in each of said common-drain regions;

implanting different types of doping impurities across said first dielectric layers into said semiconductor substrate in each of the plurality of active regions in a self-aligned manner to form a common-drain diffusion region of said second conductivity type in an upper surface portion of said semiconductor substrate, a deep implant region of said first conductive type being formed in said semiconductor substrate near a middle portion outside of said gate-dielectric layer, and a deeper implant region of said first conductivity type being formed in said semiconductor substrate near a middle portion outside of said collar-oxide layer in each of the plurality of active regions;

forming a pair of fourth sidewall dielectric spacers over outer sidewalls of nearby etched-back second sidewall dielectric spacers in each of said common-drain regions and removing said first dielectric layers and etching said first-type fourth raised field-oxide layers between said pair of fourth sidewall dielectric spacers to form a flat bed being formed alternately by said common-drain diffusion region and a first-type fifth raised field-oxide layer in each of said common-drain regions;

forming a planarized common-drain conductive layer over said flat bed between said pair of fourth sidewall dielectric spacers in each of said common-drain regions; and forming a metal layer over a formed structure surface and patterning said metal layer and said planarized common-drain conductive layers to form the plurality of metal bit-lines integrated with planarized common-drain conductive islands by using a masking photoresist step for forming a first-type contactless DRAM array.

15. The method of claim 14, wherein said masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

16. The method of claim 14, wherein said planarized capping conductive-gate layer comprises a tungsten-disilicide or tungsten layer and said metal layer comprises an aluminum or copper layer being formed over a barrier-metal layer comprising a titanium-nitride (TiN) or tantalum-nitride (TaN) layer.

17. The method of claim 14, wherein a bottom surface level of said second-type second raised field-oxide layer is approximately equal to that of said collar-oxide layer and a heavily-implanted region of said second conductivity type is formed in a surface portion of said semiconductor substrate under said second-type second raised field-oxide layer to connect with said lower capacitor nodes being formed by heavily-doped diffusion regions of said second conductivity type.

18. The method of claim 13, wherein the plurality of conductive bit-lines and the plurality of metal word-lines of said contactless DRAM array are formed by the steps comprising:

forming a pair of sidewall conductive spacers over outer sidewalls of said nearby common-drain regions and on a pair of flat surfaces being alternately formed by said conductive-gate node and said first-type third raised field-oxide layer;

etching back selectively various silicon-dioxide layers between said pair of sidewall conductive spacers to a depth approximately equal to a half thickness of said conductive-gate node;

forming a first planarized conductive layer between said pair of sidewall conductive spacers and etching back simultaneously said pair of sidewall conductive spacers and said first planarized conductive layer to a top surface level of said conductive-gate node to form a planarized conductive-gate connector;

forming again a pair of first sidewall dielectric spacers over outer sidewalls of nearby second masking dielectric layers over said first conductive layers in said common-drain regions and implanting a high-dose of doping impurities of said second conductive type into said planarized conductive-gate connectors in a self-aligned manner;

forming a second planarized conductive layer between said pair of first sidewall dielectric spacers and on said planarized conductive-gate connector and etching back selectively said second planarized conductive layers to a depth larger than a thickness of said first conductive layer to form planarized common-gate conductive layers;

forming a planarized capping-oxide layer over said planarized common-gate conductive layer between said pair of first sidewall dielectric spacers;

removing selectively said second masking dielectric layer in each of said common-drain regions and etching back selectively said first-type first raised field-oxide layers in each of said common-drain regions and said planarized capping-oxide layer and said pair of first sidewall dielectric spacers between said nearby common-drain regions to a depth equal to a thickness of said first conductive layer to form first-type fourth raised field-oxide layers, etched-back planarized capping-oxide layers, and etched-back first sidewall dielectric spacers, respectively;

implanting different types of doping impurities across said first dielectric layers into said semiconductor substrate in each of said common-drain regions in a self-aligned manner to form different implant regions in each of the plurality of active regions, wherein said different implant regions may comprise a common-drain diffusion region of said second conductivity type being formed in an upper surface portion of said semiconductor substrate, a deep implant region of said first conductivity type being formed near a middle portion outside of said gate-dielectric layer, and a deeper implant region of said first conductivity type being formed near a middle portion outside of said collar-oxide layer;

forming a pair of fourth sidewall dielectric spacers over outer sidewalls of nearby trench regions and removing said first dielectric layers and etching said first-type fourth raised field-oxide layers between said pair of fourth sidewall dielectric spacers to form a flat bed being alternately formed by said common-drain diffusion region and a first-type fifth raised field-oxide layer;

forming a highly conductive common-drain bus-line over said flat bed between said pair of fourth sidewall dielectric spacers in each of said common-drain regions, wherein said highly conductive common-drain bus-line comprises a heavily-doped polycrystalline-silicon layer silicided with a refractory metal-silicide layer or a heavily-doped polycrystalline-silicon layer capped with a tungsten-silicide or tungsten layer;

forming a third planarized thick-oxide layer over said highly conductive common-drain bus-line between said pair of fourth sidewall dielectric spacers in each of said common-drain regions, wherein said highly conductive common-drain bus-line is acted as a common-drain conductive bit-line;

removing said etched-back planarized capping-oxide layer over said planarized common-gate conductive layer by using an etching-back method or a chemical-mechanical polishing method; and forming a metal layer over a formed structure surface and patterning simultaneously said metal layer and said planarized common-gate conductive layers over said planarized conductive-gate connectors by using a masking photoresist step to form the plurality of metal word-lines integrated with planarized common-gate conductive islands over planarized conductive-gate connector islands for forming a second-type contactless DRAM array.

19. The method of claim 18, wherein said masking photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

20. The method of claim 18, wherein said planarized common-gate conductive island comprises a tungsten-disilicide or tungsten island and said metal layer comprises an aluminum or copper layer being formed over a barrier-metal layer comprising a titanium-nitride (TiN) or tantalum-nitride (TaN) layer.

* * * * *